(12) United States Patent
Chindo et al.

(10) Patent No.: US 10,680,629 B2
(45) Date of Patent: Jun. 9, 2020

(54) ATOMIC OSCILLATOR AND FREQUENCY SIGNAL GENERATION SYSTEM

(71) Applicant: Seiko Epson Corporation, Tokyo (JP)

(72) Inventors: Koji Chindo, Chino (JP); Nobuhito Hayashi, Chino (JP); Hideaki Yajima, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/395,626

(22) Filed: Apr. 26, 2019

(65) Prior Publication Data

US 2019/0334536 A1 Oct. 31, 2019

(30) Foreign Application Priority Data

Apr. 27, 2018 (JP) ................. 2018-087840

(51) Int. Cl.
| | | |
|---|---|---|
| *H03L 7/26* | (2006.01) | |
| *H03L 1/04* | (2006.01) | |
| *H03B 17/00* | (2006.01) | |
| *G04F 5/14* | (2006.01) | |

(52) U.S. Cl.
CPC ............. *H03L 7/26* (2013.01); *G04F 5/145* (2013.01); *H03B 17/00* (2013.01); *H03L 1/04* (2013.01)

(58) Field of Classification Search
CPC ........................................................ H03L 7/26
USPC ........................................................ 331/94.1
See application file for complete search history.

(56) References Cited

U.S. PATENT DOCUMENTS

| | | |
|---|---|---|
| 2011/0187464 A1 | 8/2011 | Youngner et al. |
| 2011/0232782 A1 | 9/2011 | Borwick, III et al. |
| 2012/0206135 A1 | 8/2012 | Nagasaka et al. |
| 2012/0243088 A1 | 9/2012 | Nagasaka |
| 2013/0047417 A1 | 2/2013 | Nagasaka |
| 2015/0028866 A1 | 1/2015 | Parsa et al. |
| 2015/0061785 A1 | 3/2015 | Ishihara |
| 2015/0180490 A1 | 6/2015 | Chindo |
| 2016/0025822 A1* | 1/2016 | Takahashi ............ G01R 33/032 324/244.1 |
| 2016/0308543 A1 | 10/2016 | Ishihara |
| 2017/0099060 A1 | 4/2017 | Chindo |

FOREIGN PATENT DOCUMENTS

| | | |
|---|---|---|
| JP | H10-290041 A | 10/1998 |
| JP | 2012-183290 A | 9/2012 |
| JP | 2012-198183 A | 10/2012 |

(Continued)

*Primary Examiner* — Joseph Chang
(74) *Attorney, Agent, or Firm* — Harness, Dickey & Pierce, P.L.C.

(57) ABSTRACT

An atomic oscillator includes a light emitting element, an atomic cell, and a light receiving element that receives the light passing through the atomic cell. The atomic cell has a first chamber containing alkali metal atoms in a gas state and having a first wall through which the light from the light emitting element passes, a second chamber containing alkali metal atoms in a liquid state and having a second wall, a passage connecting the first chamber and the second chamber to each other, and a part which is disposed between the first chamber and the second chamber and has a thermal conductivity lower than the thermal conductivity of a material forming the first wall and the thermal conductivity of a material forming the second wall.

9 Claims, 14 Drawing Sheets

(56) References Cited

FOREIGN PATENT DOCUMENTS

| | | | |
|---|---|---|---|
| JP | 2013-007720 | A | 1/2013 |
| JP | 2013-065819 | A | 4/2013 |
| JP | 2014-110464 | A | 6/2014 |
| JP | 2015-053304 | A | 3/2015 |
| JP | 2015-122597 | A | 7/2015 |
| JP | 2016-207695 | A | 12/2016 |
| JP | 2016-213285 | A | 12/2016 |
| JP | 2017-073623 | A | 4/2017 |
| JP | 2018-036127 | A | 3/2018 |

\* cited by examiner

ATOMIC OSCILLATOR AND FREQUENCY SIGNAL GENERATION SYSTEM

The present application is based on and claims priority from JP Application Serial Number 2018-087840, filed Apr. 27, 2018, the disclosure of which is hereby incorporated by reference herein in its entirety.

BACKGROUND

1. Technical Field

The present disclosure relates to an atomic oscillator and a frequency signal generation system.

2. Related Art

As an oscillator having high precision oscillation characteristics in the long term, an atomic oscillator oscillating based on energy transition of alkali metal atoms such as cesium is known. The atomic oscillator includes a light source, an atomic cell in which alkali metal atoms such as cesium or the like are sealed, and a light receiving element for receiving a light passing through the atomic cell.

For example, JP-A-2015-53304 discloses an atomic oscillator including an atomic cell in which a gas container containing metal atoms in a gas state and a metal accumulator containing metal atoms in a liquid or solid state. Generally, the temperature of the metal accumulator is lower than the temperature of the gas container.

However, in the atomic oscillator of JP-A-2015-53304, the gas container and the metal accumulator are formed by forming through holes in a main body portion configured of a glass material, a silicon material, or the like. Therefore, if a thermal conductivity of a material forming the main body portion is high, one of the temperatures of the gas container and the metal accumulator is influenced by the other, thereby, for example, alkali metal atoms is precipitated in the gas container, and an oscillation frequency of the atomic oscillator fluctuates in some cases.

On the other hand, if a thermal conductivity of a material forming the main body portion is low, it is difficult for a temperature distribution to become uniform in the gas container. Therefore, a light having various temperature dependencies is received by a light receiving element, and the oscillation frequency varies in some cases.

SUMMARY

An atomic oscillator according to an aspect of the present disclosure includes a light emitting element that emits a light, an atomic cell, and a light receiving element that receives the light passing through the atomic cell, in which the atomic cell has a first chamber containing alkali metal atoms in a gas state and having a first wall through which the light emitted from the light emitting element passes, a second chamber containing alkali metal atoms in a liquid state and having a second wall, a passage connecting the first chamber and the second chamber to each other, and a part which is disposed between the first chamber and the second chamber and has a thermal conductivity lower than the thermal conductivity of a material forming the first wall and the thermal conductivity of a material forming the second wall.

In the atomic oscillator according to the aspect of the present disclosure, the part may have a slit structure or a hollow structure.

In the atomic oscillator according to the aspect of the present disclosure, the part may include a wall, and a low thermal conductivity member disposed on the wall and having the thermal conductivity lower than the thermal conductivity of the material forming the first wall and the thermal conductivity of the material forming the second wall.

In the atomic oscillator according to the aspect of the present disclosure, a high thermal conductivity member having the thermal conductivity higher than the thermal conductivity of the material forming the first wall may be disposed on an outer surface of the first wall.

In the atomic oscillator according to the aspect of the present disclosure, the part may have the slit structure or the hollow structure, and the high thermal conductivity member may be disposed on a wall of the part on a side of the first chamber.

In the atomic oscillator according to the aspect of the present disclosure, the first wall may have a window through which the light emitted from the light emitting element passes, the high thermal conductivity member may be disposed on an outer surface of the window, and the high thermal conductivity member may be provided with a through hole through which the light emitted from the light emitting element passes.

In the atomic oscillator according to the aspect of the present disclosure, the part may have the slit structure, and a wall of the part may include a first part connecting the first chamber and the second chamber to each other, a second part configuring the slit structure on one side of the first part, and a third part configuring the slit structure on the other side of the first part.

In the atomic oscillator according to the aspect of the present disclosure, the second wall may include a fourth part, a fifth part having a temperature lower than the temperature of the fourth part, and a sixth part configuring the slit structure between the fourth part and the fifth part.

A frequency signal generation system according to an aspect of the present disclosure includes an atomic oscillator, in which the atomic oscillator includes a light emitting element that emits a light, an atomic cell, and a light receiving element that receives the light passing through the atomic cell, the atomic cell has a first chamber containing alkali metal atoms in a gas state and having a first wall through which the light emitted from the light emitting element passes, a second chamber containing alkali metal atoms in a liquid state and having a second wall, a passage connecting the first chamber and the second chamber to each other, and a part which is disposed between the first chamber and the second chamber and has a thermal conductivity lower than the thermal conductivity of a material forming the first wall and the thermal conductivity of a material forming the second wall.

DESCRIPTION OF EXEMPLARY EMBODIMENTS

Hereinafter, preferred embodiments of the present disclosure will be described in detail with reference to the drawings. Note that the embodiments described below do not unduly limit the contents of the present disclosure described in the appended claims. Also, not all of the configurations described below are necessarily essential components of the present disclosure.

1. First Embodiment

1.1. Atomic Oscillator

1.1.1. Outline

Figure 1:
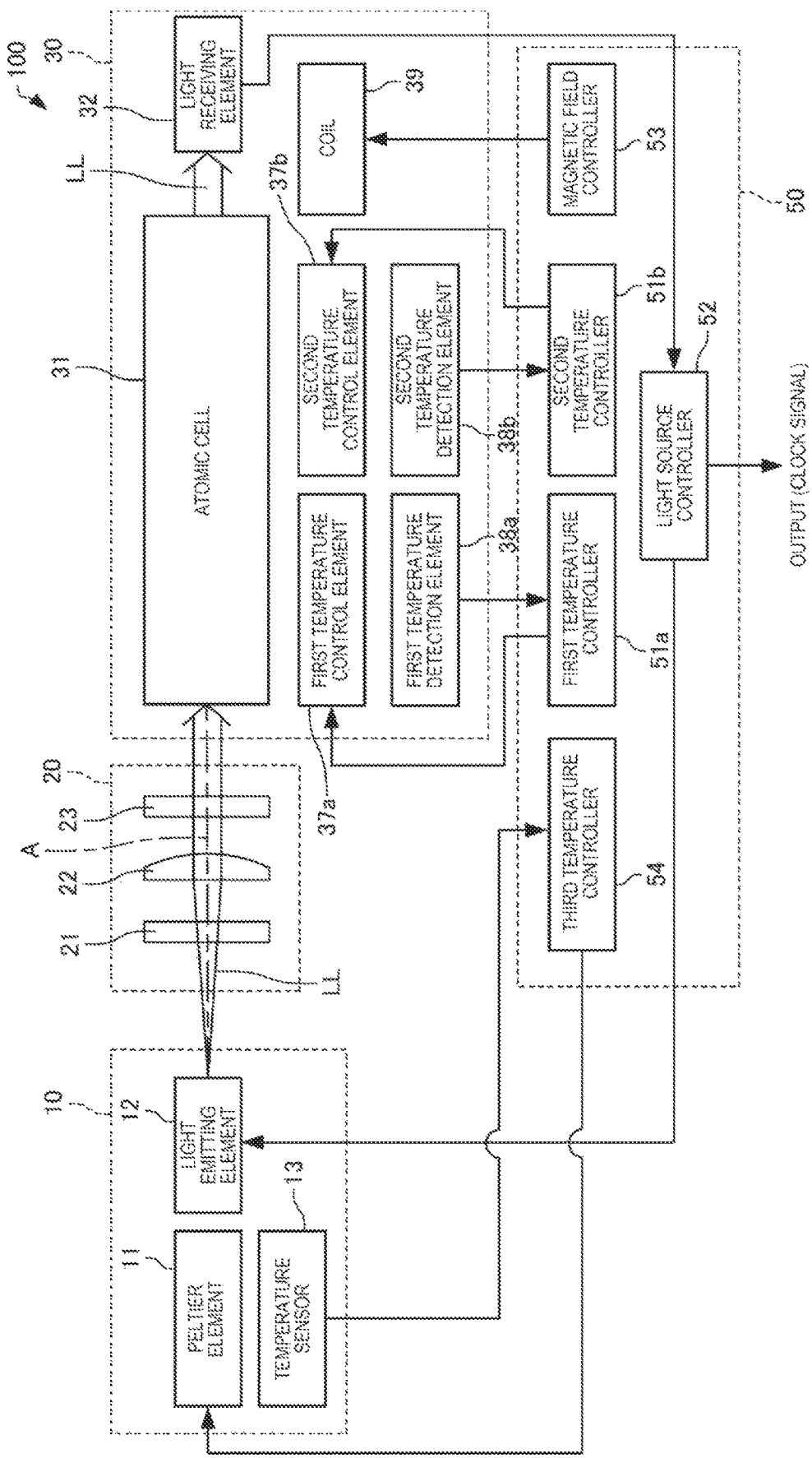
FIG. 1 is a schematic view showing an atomic oscillator according to a first embodiment.

First, an atomic oscillator according to a first embodiment will be described with reference to the drawings. FIG. 1 is a schematic view showing an atomic oscillator 100 according to the first embodiment.

The atomic oscillator 100 is an atomic oscillator using a quantum interference effect (CPT: Coherent Population Trapping) in which, when alkali metal atoms are simultaneously irradiated with two resonance lights of specific wavelengths different each other, a phenomenon occurs where the two resonant lights are transmitted without being absorbed by the alkali metal atoms. Note that the phenomenon due to the quantum interference effect is also referred to as an electromagnetically induced transparency (EIT) phenomenon. Further, the atomic oscillator according to the present disclosure may be an atomic oscillator using a double resonance phenomenon by a light and a microwave.

As shown in FIG. 1, the atomic oscillator 100 includes a light source unit 10, an optical system unit 20, an atomic cell unit 30, and a control unit 50 for controlling the light source unit 10 and the atomic cell unit 30. Hereinafter, an outline of the atomic oscillator 100 will be described first.

The light source unit 10 has a Peltier element 11, a light emitting element 12, and a temperature sensor 13.

The light emitting element 12 emits a linearly polarized light LL containing two kinds of lights having different frequencies. The light emitting element 12 is, for example, a vertical cavity surface emitting laser (VCSEL). The temperature sensor 13 detects the temperature of the light emitting element 12. The Peltier element 11 controls the temperature of the light emitting element 12.

The optical system unit 20 is disposed between the light source unit 10 and the atomic cell unit 30. The optical system unit 20 has a neutral density filter 21, a lens 22, and a quarter wavelength plate 23.

The neutral density filter 21 reduces the intensity of the light LL emitted from the light emitting element 12. The lens 22 adjusts a radiation angle of the light LL. Specifically, the lens 22 makes the light LL into a parallel light. The quarter wavelength plate 23 converts the two kinds of lights having different frequencies included in the light LL from a linearly polarized light to a circularly polarized light.

The atomic cell unit 30 includes an atomic cell 31, a light receiving element 32, a first temperature control element 37a, a second temperature control element 37b, a first temperature detection element 38a, a second temperature detection element 38b, and a coil 39.

The atomic cell 31 contains alkali metal atoms. The alkali metal atom has an energy level of a three-level system configured with two ground levels different from each other and an excitation level. The light LL emitted from the light emitting element 12 is incident on the atomic cell 31 via the neutral density filter 21, the lens 22, and the quarter wavelength plate 23.

The light receiving element 32 receives and detects the light LL passed through the atomic cell 31. The light receiving element 32 is, for example, a photodiode.

The first temperature control element 37a heats the alkali metal atoms contained in the atomic cell 31 and brings at least a part of the alkali metal atoms into a gas state. The first temperature control element 37a is, for example, a heater. The first temperature detection element 38a detects the temperature of the atomic cell 31. The second temperature control element 37b, for example, heats the atomic cell 31 to a temperature lower than the temperature of the first temperature control element 37a. The second temperature control element 37b is, for example, a Peltier element. The second temperature detection element 38b detects the temperature of the atomic cell 31. The temperature detection elements 38a and 38b, and the temperature sensor 13 are, for example, thermistors or the like.

The coil 39 applies a magnetic field in a predetermined direction to the alkali metal atoms contained in the atomic cell 31 and Zeeman splits an energy level of the alkali metal atoms. When the alkali metal atoms are irradiated with a pair of circularly polarized resonance light in a state where the alkali metal atoms are Zeeman split, the number of alkali metal atoms having a desired energy level is relatively larger than the number of alkali metal atoms having other energy levels among a plurality of levels of the alkali metal atoms that are Zeeman split. Therefore, the number of atoms that develops a desired EIT phenomenon increases, and a desired EIT signal increases. As a result, the oscillation characteristics of the atomic oscillator 100 can be improved.

The control unit 50 includes a first temperature controller 51a, a second temperature controller 51b, a light source controller 52, a magnetic field controller 53, and a third temperature controller 54. Based on a detection result of the first temperature detection element 38a, the first temperature controller 51a controls carrying of electricity to the first temperature control element 37a so that an inside of the atomic cell 31 becomes a desired temperature. Based on a detection result of the second temperature detection element 38b, the second temperature controller 51b controls carrying of electricity to the second temperature control element 37b so that the inside of the atomic cell 31 becomes a desired temperature. The magnetic field controller 53 controls carrying of electricity to the coil 39 so that the magnetic field generated by the coil 39 is constant. Based on a detection result of the temperature sensor 13, the third temperature controller 54 controls carrying of electricity to the Peltier element 11 so that the temperature of the light emitting element 12 becomes a desired temperature.

Based on a detection result of the light receiving element 32, the light source controller 52 controls frequencies of two kinds of lights included in the light LL emitted from the light emitting element 12 so that the EIT phenomenon occurs. Here, the EIT phenomenon occurs when the two kinds of lights become a pair of resonant lights of a frequency difference corresponding to an energy difference between two ground levels of the alkali metal atoms contained in the atomic cell 31. The light source controller 52 includes a voltage controlled oscillator (not shown) in which an oscillation frequency is controlled so as to be stabilized in synchronization with the control of the frequencies of the two kinds of lights, and outputs an output signal of the voltage controlled oscillator (VOC) as an output signal (clock signal) of the atomic oscillator 100.

1.1.2. Specific Configuration

Figure 2:
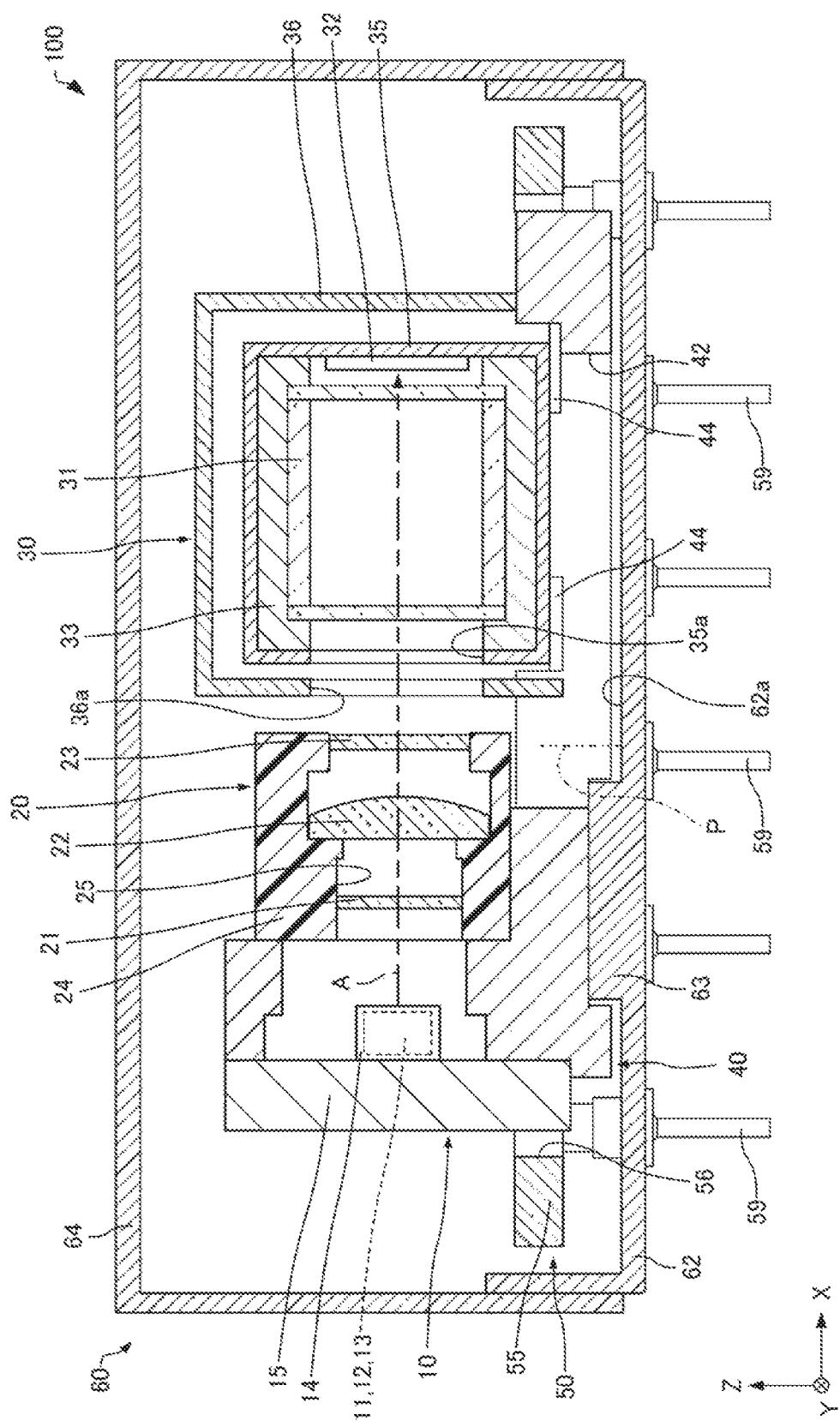
FIG. 2 is a cross-sectional view schematically showing the atomic oscillator according to the first embodiment.
Figure 3:
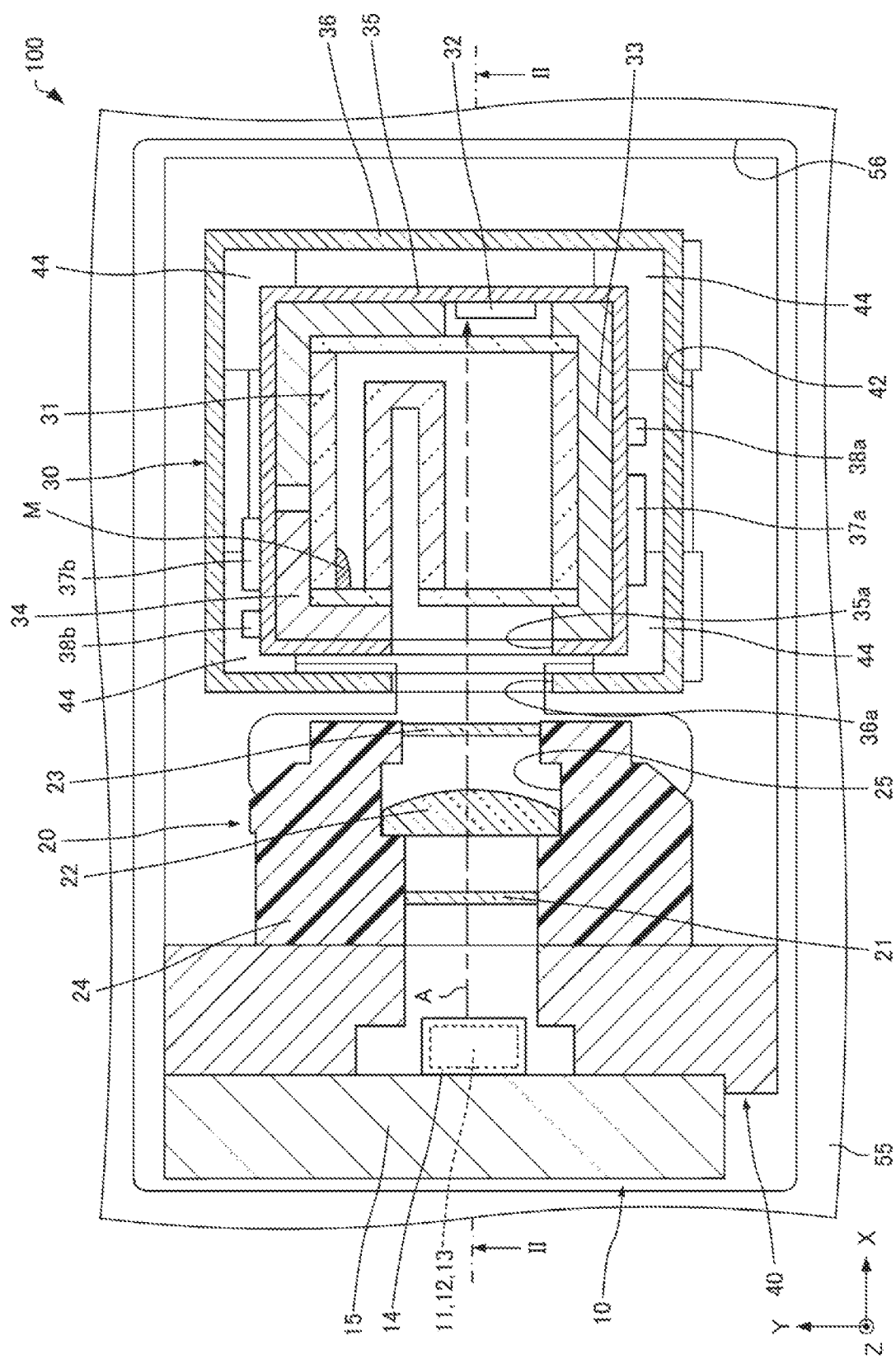
FIG. 3 is a cross-sectional view schematically showing the atomic oscillator according to the first embodiment.

Next, a specific configuration of the atomic oscillator 100 will be described. FIGS. 2 and 3 are cross-sectional views schematically showing the atomic oscillator 100. Note that FIG. 2 is a cross-sectional view taken along the line II-II in FIG. 3. In FIGS. 2 and 3, and FIGS. 4 and 5 to be described later, X, Y, and Z axes are shown as three axes orthogonal to each other.

As shown in FIGS. 2 and 3, the atomic oscillator 100 includes the light source unit 10, the optical system unit 20, the atomic cell unit 30, a supporting member 40, the control unit 50, and an outer container 60.

Here, the Z axis is an axis along the perpendicular P of an inner surface 62a of a base body 62 of the outer container 60, and the Z axis+direction is a direction from the inner surface 62a to a component disposed on the inner surface 62a. The X axis is an axis along the light emitted from the light source unit 10 and the X axis+direction is a direction in which the light emitted from the light source unit 10 advances. The Y axis is an axis perpendicular to the X axis and the Z axis and the Y axis+direction is a direction from the front to the back when the Z axis+direction is up and the X axis+direction is directed to the right.

The light source unit 10 is disposed on the supporting member 40. The light source unit 10 includes the Peltier element 11, the light emitting element 12, the temperature sensor 13, a light source container 14 which contains the Peltier element 11, the light emitting element 12, and the temperature sensor 13, and a light source substrate 15 on which the light source container 14 is disposed. The light source substrate 15 is, for example, fixed to the supporting member 40. The Peltier element 11, the light emitting element 12, and the temperature sensor 13 are electrically connected to the control unit 50.

The optical system unit 20 is disposed on the supporting member 40. The optical system unit 20 has the neutral density filter 21, the lens 22, the quarter wavelength plate 23, and a holder 24 which holds the neutral density filter 21, the lens 22, and the quarter wavelength plate 23. The holder 24 is, for example, fixed to the supporting member 40.

The holder 24 is provided with a through hole 25. The through hole 25 is a passing area of the light LL. In the through hole 25, the neutral density filter 21, the lens 22, and the quarter wavelength plate 23 are arranged in the order from the light source unit 10 side.

The atomic cell unit 30 includes the atomic cell 31, the light receiving element 32, a first holding member 33, a second holding member 34, a first atomic cell container 35, a second atomic cell container 36, the first temperature control element 37a, the second temperature control element 37b, the first temperature detection element 38a, and the second temperature detection element 38b.

Figure 4:
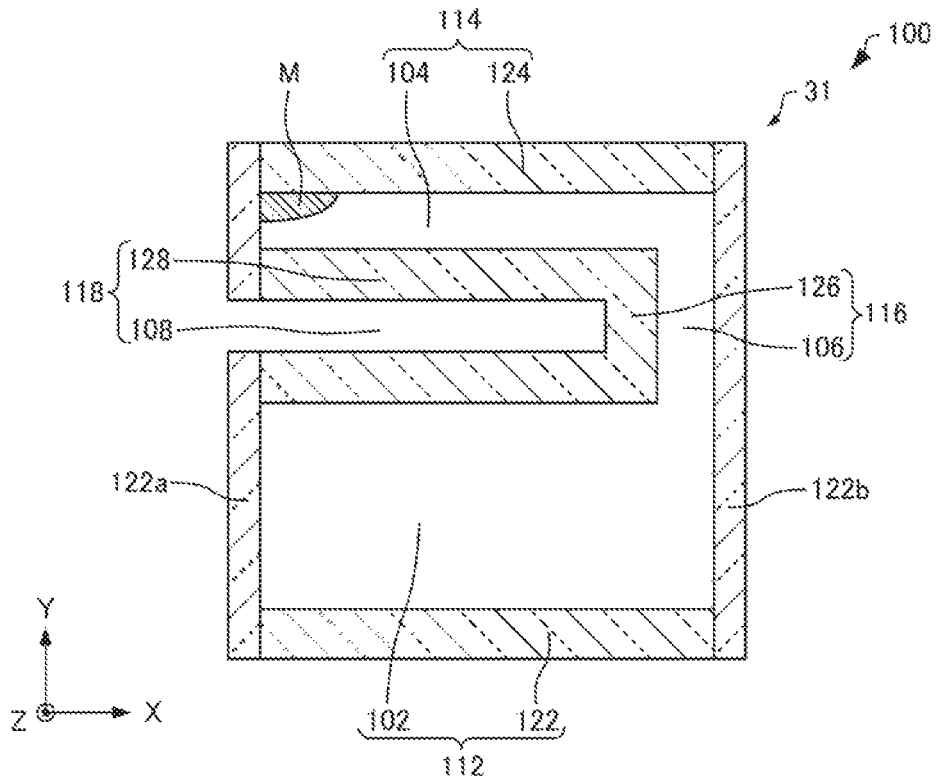
FIG. 4 is a cross-sectional view schematically showing an atomic cell of the atomic oscillator according to the first embodiment.
Figure 5:
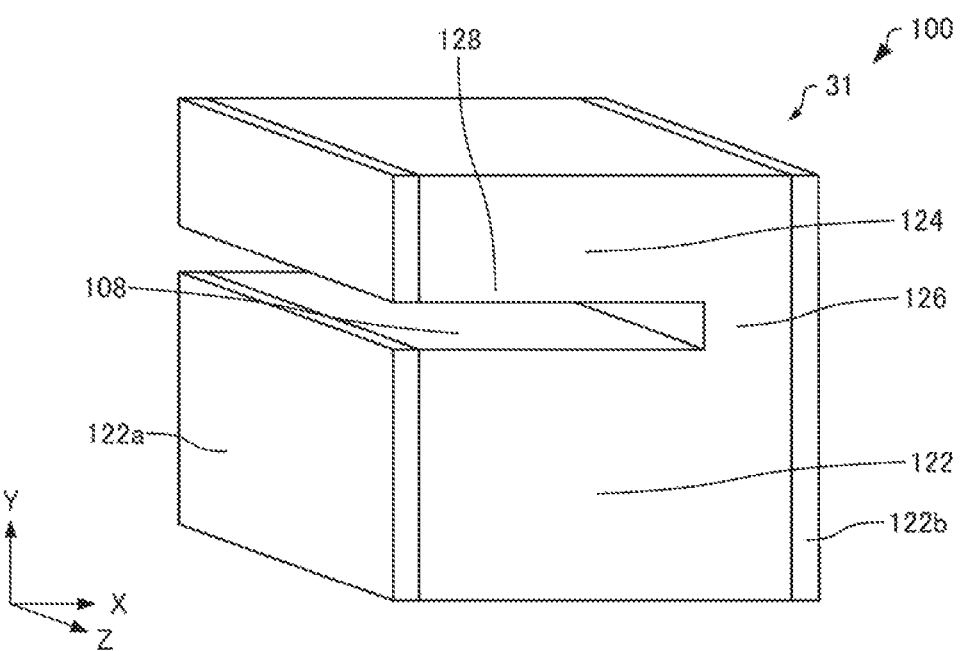
FIG. 5 is a perspective view schematically showing the atomic cell of the atomic oscillator according to the first embodiment.

FIG. 4 is a cross-sectional view schematically showing the atomic cell 31 of the atomic cell unit 30. FIG. 5 is a perspective view schematically showing the atomic cell 31 of the atomic cell unit 30. As shown in FIGS. 4 and 5, the atomic cell 31 includes a first chamber 112, a second chamber 114, a passage 116, and a low thermal conductivity portion 118, through which the light emitted from the light emitting element 12 passes.

The first chamber 112 contains alkali metal atoms in a gas state. The first chamber 112 has a first space 102 and a first wall 122 defining the first space 102. The alkali metal atoms in a gas state are present in the first space 102. The first wall 122 has a first window 122a and a second window 122b through which the light emitted from the light emitting element 12 passes. The light emitted from the light emitting element 12 is incident on the first chamber 112 from the first window 122a, and emitted from the second window 122b. In the illustrated example, the first window 122a is a part of the X axis − side of the first wall 122. The second window 122b is a part of the X axis+side of the first wall 122. Although not shown, the second window 122b may be integrally provided with a part other than the first window 122a of the first wall 122.

The second chamber 114 contains alkali metal atoms M in a liquid state. Therefore, when the alkali metal atoms in a gas state contained in the first chamber 112 are reduced due to a reaction with the first wall 122 or the like, the liquid alkali metal atoms M are vaporized and a concentration of the alkali metal atoms in a gas state present in the first chamber 112 can be kept constant. The second chamber 114 has a second space 104 and a second wall 124 defining the second space 104. In the illustrated example, the alkali metal atoms M in a liquid state are present in contact with the second wall 124 at a corner portion opposite to the first chamber 112 side of the second space 104. The length along the X axis of the second space 104 of the second chamber 114 is, for example, the same as the length along the X axis of the first space 102 of the first chamber 112.

The passage 116 connects the first chamber 112 and the second chamber 114 to each other. The passage 116 is disposed between the first chamber 112 and the second chamber 114. The passage 116 has a third space 106 and a third wall 126 defining the third space 106. The third space 106 connects the first space 102 and the second space 104 to each other. The third wall 126 connects to the first wall 122 and the second wall 124 to each other. The length along the X axis of the passage 116 is smaller than the length along the X axis of the chambers 112 and 114.

The shape of the inner wall surface of the first chamber 112, the second chamber 114, and the passage 116 is, for example, a cylinder shape. The outer shape of the first wall 122, the second wall 124, and the third wall 126 is, for example, a rectangular parallelepiped shape. The material of the walls 122, 124 and 126 is, for example, a glass, more specifically an aluminosilicate glass. Note that the material of a part other than the windows 122a and 122b among the walls 122, 124, and 126 may be a silicon.

The low thermal conductivity portion 118 is disposed between the first chamber 112 and the second chamber 114. In the illustrated example, the low thermal conductivity portion 118 is a slit structure having a fourth space 108 and a fourth wall 128 defining the fourth space 108. In the illustrated example, the low thermal conductivity portion 118 is a slit structure in which the −X axial direction side, the +Z axial direction side, and the −Z axial direction side of the space 108 are opened. In the illustrated example, a part of the fourth wall 128 on the −Y axis direction side is a part of the first wall 122. A part of the fourth wall 128 on the +Y axis direction side is a part of the second wall 124. A part of the fourth wall 128 on the +X axis direction side is a part of the third wall 126.

The low thermal conductivity portion 118 is a part having a lower thermal conductivity than the thermal conductivity of the material forming the first wall 122 and the thermal conductivity of the material forming the second wall 124. The low thermal conductivity portion 118 may be such that the thermal conductivity of at least a part of the low thermal conductivity portion 118 is lower than the thermal conductivity of the materials forming the walls 122 and 124. In the illustrated example, the thermal conductivity of the space 108 is lower than the thermal conductivity of the materials forming the walls 122, 124, and 126. Nitrogen may be present in the space 108. Air may be present in the space 108. The space 108 may be in a vacuum state that is in a state where a pressure is lower than the atmospheric pressure. When gas is present in the space 108, the thermal conductivity of the gas is the thermal conductivity of the space 108.

Note that the magnitude of the thermal conductivity may be determined, for example, by specifying the material and comparing a value known as the thermal conductivity of the material, or by measuring the thermal conductivity by a hot wire method or the like and comparing a measurement result.

Regarding a manufacturing method of the atomic cell 31, for example, firstly, a rectangular parallelepiped member to be the walls 122, 124, and 126 are prepared, and the space 108 is formed by cutting, etching, or the like. Next, a through hole is formed from one side of the rectangular parallelepiped member with a drill or the like to form the first space 102 and the second space 104. Next, a hole is formed from the other side of the rectangular parallelepiped member to form the third space 106. Next, the windows 122a and 122b are connected to the rectangular parallelepiped member. In this manner, the atomic cell 31 can be manufactured.

As shown in FIGS. 2 and 3, the light receiving element 32 receives the light that has passed through the first chamber 112. The light receiving element 32 is disposed on the side opposite to the light emitting element 12 with respect to the first chamber 112. In the illustrated example, the light receiving element 32 is disposed in the first atomic cell container 35. The light receiving element 32 is electrically connected to the control unit 50.

The first holding member 33 and the second holding member 34 hold the atomic cell 31. The holding members 33 and 34 are disposed on an outer surface of the atomic cell 31. The thermal conductivity of a material forming the holding members 33 and 34 is higher than the thermal conductivity of a material forming the walls 122, 124, and 126 and the thermal conductivity of a material forming the first atomic cell container 35. A material of the holding members 33 and 34 is, for example, an aluminum, a titanium, a copper, a brass, or the like.

The first holding member 33 transmits a heat of the first temperature control element 37a to the alkali metal atoms in a gas state contained in the first chamber 112. The first holding member 33 is disposed on the first wall 122. The first holding member 33 is disposed so as to surround the first chamber 112, for example. The first holding member 33 is also disposed on a part of the third wall 126 and the second wall 124, for example.

The second holding member 34 transmits a heat of the second temperature control element 37b to the alkali metal atoms M in a liquid state contained in the second chamber 114. The second holding member 34 is disposed so as to surround the alkali metal atoms M in a liquid state, for example. The temperature of the second holding member 34 is lower than the temperature of the first holding member 33. The second holding member 34 is disposed apart from the first holding member 33. The holding members 33 and 34 have a structure allowing the light emitted from the light emitting element 12 to pass therethrough.

The first atomic cell container 35 contains the atomic cell 31, the light receiving element 32, and the holding members 33 and 34. The first atomic cell container 35 has a substantially rectangular parallelepiped outer shape. The first atomic cell container 35 is provided with a through hole 35a through which the light emitted from the light emitting element 12 passes. A material of the first atomic cell container 35 is, for example, a permalloy, a silicon iron, or the like. By using such a material, the first atomic cell container 35 can shield a magnetic field from the outside. As a result, the first atomic cell container 35 can inhibit the alkali metal atoms in the atomic cell 31 from being influenced by the magnetic field from the outside and stabilize the oscillation characteristics of the atomic oscillator 100.

The first temperature control element 37a and the first temperature detection element 38a are disposed on the outer surface of the first atomic cell container 35, for example. In the illustrated example, the first temperature control element 37a and the first temperature detection element 38a are disposed on the outer surface of a part in contact with the first holding member 33 of the first atomic cell container 35. The first temperature control element 37a heats the first chamber 112 via the first atomic cell container 35 and the first holding member 33.

The second temperature control element 37b and the second temperature detection element 38b are disposed on the outer surface of the first atomic cell container 35. Specifically, the second temperature control element 37b and the second temperature detection element 38b are disposed on the outer surface of a part in contact with the second holding member 34 of the first atomic cell container 35. The second temperature control element 37b heats the second chamber 114 via the first atomic cell container 35 and the second holding member 34. Alternatively, the second temperature control element 37b, for example, dissipates the heat of the second chamber 114 to the outside via the first atomic cell container 35 and the second holding member 34, and cools the second chamber 114.

The second atomic cell container 36 contains the first atomic cell container 35, the temperature control elements 37a and 37b, and the temperature detection elements 38a and 38b. The second atomic cell container 36 is provided with a through hole 36a through which the light emitted from the light emitting element 12 passes. A material of the second atomic cell container 36 is, for example, the same as the material of the first atomic cell container 35. The second atomic cell container 36 can shield the magnetic field from the outside. The first atomic cell container 35 and the second atomic cell container 36 are disposed, for example, apart from each other. Therefore, compared with a case where, for example, the first atomic cell container 35 and the second atomic cell container 36 are in contact with each other, a function of shielding the magnetic field from the outside can be enhanced.

Note that, although not shown in FIGS. 2 and 3, for example, the coil 39 may be a solenoid type coil wound around the outer circumference of the atomic cell 31, or a pair of Helmholtz type coils facing each other via the atomic cell 31. The coil 39 generates a magnetic field in the atomic cell 31 in a direction along an optical axis A of the light. Thereby, a gap between different degenerate energy levels of the alkali metal atoms contained in the atomic cell 31 can be expanded by Zeeman split, a resolution can be improved, and a line width of the EIT signal can be reduced.

As shown in FIG. 2, the supporting member 40 is cantilevered and fixed to the base body 62 of the outer container 60. In the illustrated example, the supporting member 40 is fixed to a pedestal portion 63 of the base body 62. A material of the supporting members 40 is, for example, an aluminum, or a copper. The supporting member 40 may be a carbon sheet using a carbon fiber.

The supporting member 40 is provided with a through hole 42. The through hole 42 passes through the supporting member 40 in the Z axis direction. When viewed from the Z axis direction, the atomic cell unit 30 is disposed so as to overlap with the through hole 42. The atomic cell unit 30 is supported by the supporting member 40. In the illustrated example, the first atomic cell container 35 is supported by the supporting member 40 via a spacer 44. A material of the spacer 44 is, for example, a resin such as an engineering plastic, a liquid crystal polymer (LCP) resin, a polyether ether ketone (PEEK), or the like.

The control unit 50 has a circuit substrate 55. The circuit substrate 55 is fixed to the base body 62 of the outer container 60 via a plurality of lead pins 59. An integrated circuit (IC) chip (not shown) is disposed on the circuit substrate 55, and the IC chip functions as the temperature controllers 51a, 51b, and 54, the light source controller 52, and the magnetic field controller 53. The IC chip is electrically connected to the light source unit 10 and the atomic cell unit 30. The circuit substrate 55 is provided with a through hole 56 through which the supporting member 40 is inserted.

The outer container 60 contains the light source unit 10, the optical system unit 20, the atomic cell unit 30, the supporting member 40, and the control unit 50. The outer container 60 has the base body 62 and a lid body 64 that is a separate body from the base body 62. A material of the outer container 60 is, for example, the same as the material of the first atomic cell container 35. Therefore, the outer container 60 can shield a magnetism from the outside, and inhibit the alkali metal atoms in the atomic cell 31 from being influenced by the magnetism from the outside. The inside of the outer container 60 may be a nitrogen atmosphere or a vacuum.

The atomic oscillator 100 has, for example, the following effects.

In the atomic oscillator 100, the atomic cell 31 is disposed between the first chamber 112 and the second chamber 114, and includes a low thermal conductivity portion 118 having a thermal conductivity lower than the thermal conductivity of the material forming the first wall 122 and the thermal conductivity of the material forming the second wall 124. Therefore, in the atomic oscillator 100, as compared with the case where the thermal conductivity of the part defined by the fourth wall is the same as the thermal conductivity of the first wall and the second wall, it is difficult for the first chamber 112 to be influenced by the temperature of the second chamber 114. Therefore, in the atomic oscillator 100, for example, it is difficult for the alkali metal atoms to be precipitated in the first chamber 112 by the temperature of the second chamber 114, and the oscillation frequency of the atomic oscillator 100 is hard to fluctuate. Alternatively, since it is difficult for the second chamber 114 to be influenced by the temperature of the first chamber 112, the concentration of the alkali metal atoms in a gas state contained in the first chamber 112 can be easily set to a desired value and the oscillation frequency of the atomic oscillator 100 is hard to fluctuate.

Furthermore, since the thermal conductivity of the material forming the walls 122 and 124 is higher than the thermal conductivity of the low thermal conductivity portion 118, for example, the heat of the temperature control elements 37a and 37b is easily transmitted to the chambers 112 and 114 respectively, as compared with the case where the entire wall of the atomic cell 31 is made of a material having a low thermal conductivity. Therefore, a uniformity of the temperature distribution in the chambers 112 and 114 is good, and a temperature controllability of the chambers 112 and 114 is good. Accordingly, the oscillation frequency of the atomic oscillator 100 hardly varies.

As described above, in the atomic oscillator 100, it is possible to stabilize the oscillation frequency.

Figure 6:
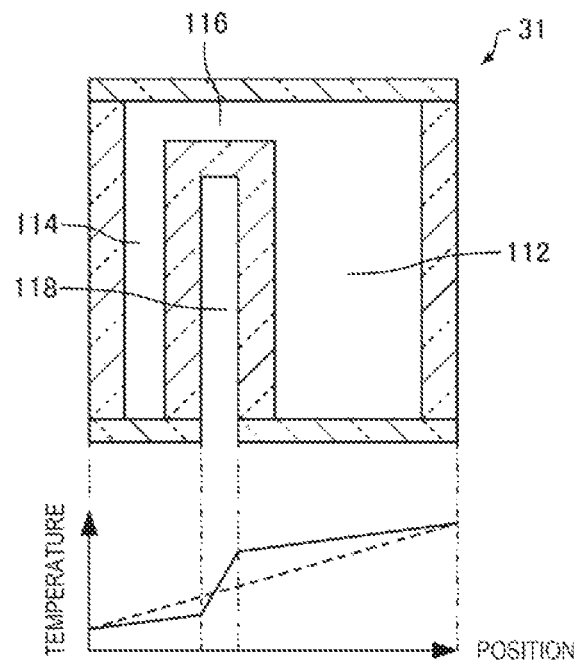
FIG. 6 is a graph schematically showing a relationship between a position and a temperature of the atomic cell.

Here, FIG. 6 is a graph schematically showing a relationship between a position along a way from the second chamber 114 of the atomic cell 31 toward the first chamber 112 and the temperature of the atomic cell 31. In FIG. 6, a solid line indicates the atomic cell 31 of the atomic oscillator 100, a broken line indicates the atomic cell in a case where the thermal conductivity of a part defined by the fourth wall is the same as the thermal conductivity of the first wall and the second wall. In the atomic oscillator 100, as shown in FIG. 6, the temperature difference between the first chamber 112 and the second chamber 114 is large, and the uniformity of the temperature distribution is good in the first chamber 112 and the second chamber 114.

Note that, although not shown, the atomic oscillator 100 may not have the second temperature control element 37b and the second temperature detection element 38b. In this case, the second chamber 114 can be cooled by natural cooling. In the atomic oscillator 100, since the thermal conductivity of the second wall 124 is higher than the thermal conductivity of the part defined by the fourth wall 128, for example, as compared with the case where the thermal conductivity of the second wall is the same as the thermal conductivity of the part defined by the fourth wall, the heat of the second chamber 114 is easily dissipated via the second wall 124 and the temperature controllability of the second chamber 114 is good.

In the atomic oscillator 100, the low thermal conductivity portion 118 has a slit structure. Therefore, in the atomic oscillator 100, for example, the low thermal conductivity portion 118 can be formed more easily as compared with the case where the low thermal conductivity portion has a hollow structure.

1.2. Modification Example of Atomic Oscillator

1.2.1. First Modification Example

Figure 7:
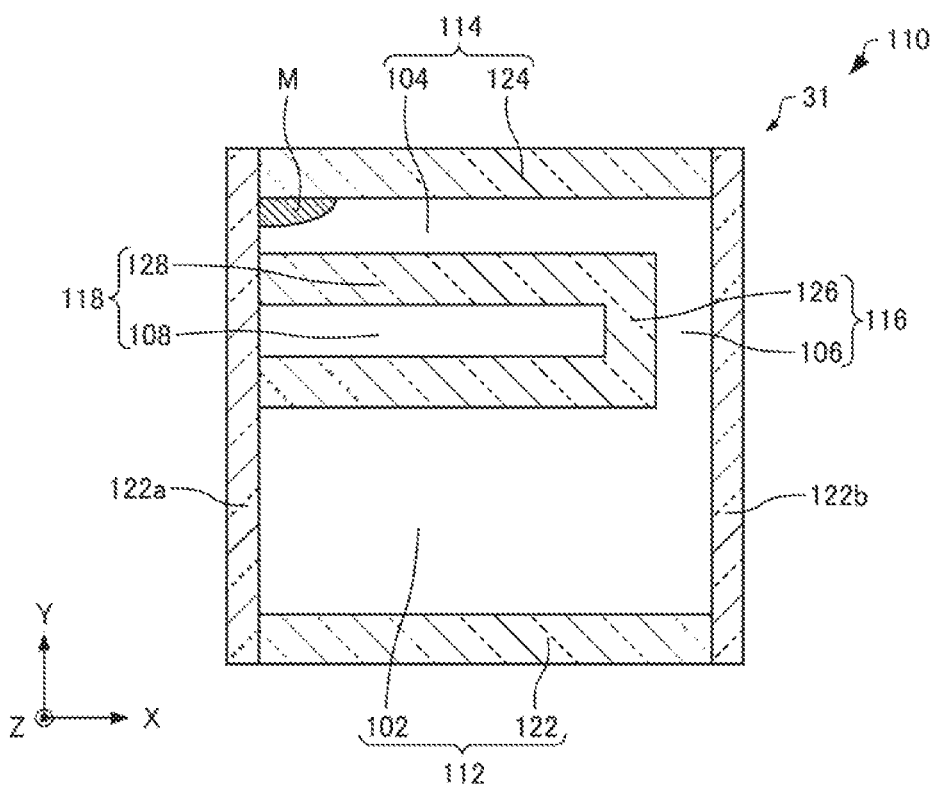
FIG. 7 is a cross-sectional view schematically showing an atomic cell of the atomic oscillator according to a first modification example of the first embodiment.
Figure 8:
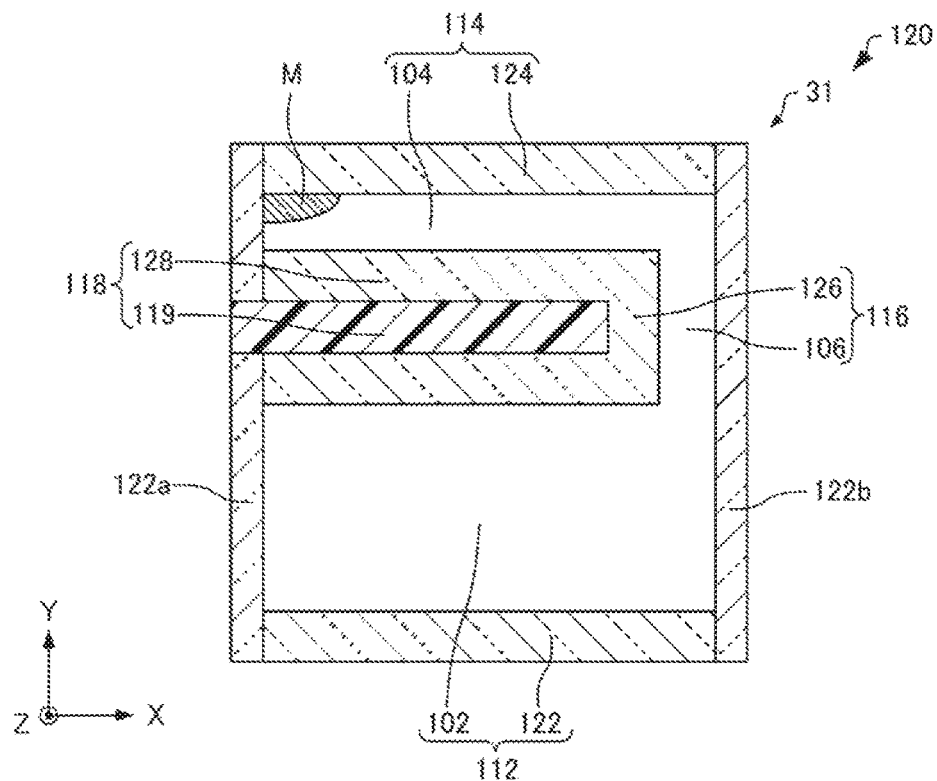
FIG. 8 is a cross-sectional view schematically showing an atomic cell of the atomic oscillator according to a second modification example of the first embodiment.
Figure 9:
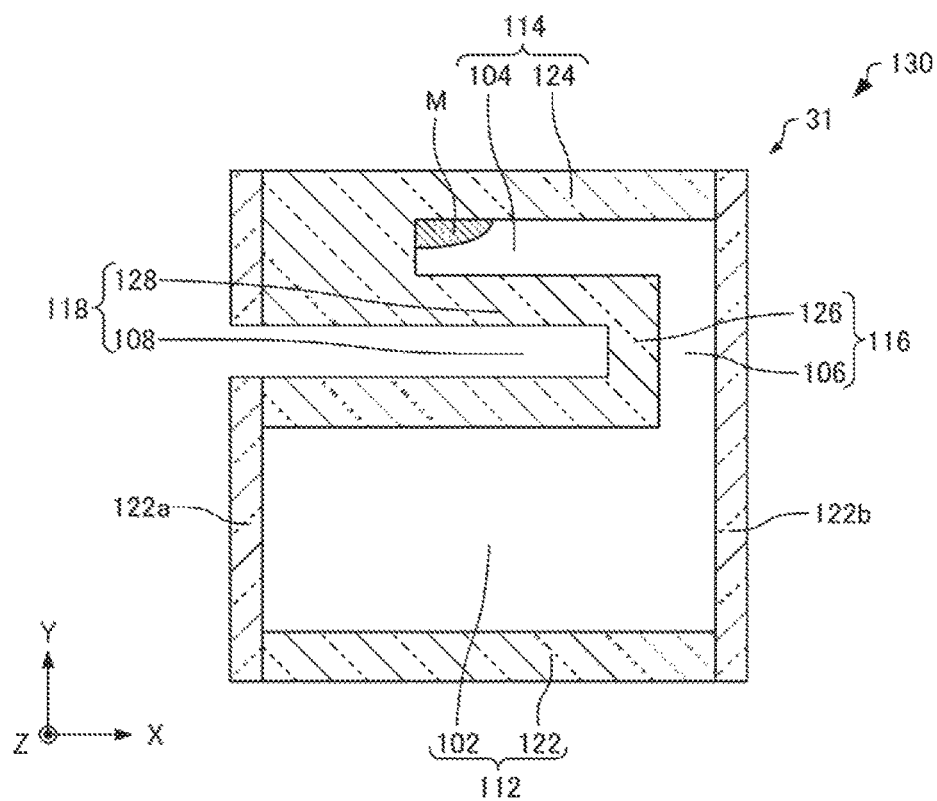
FIG. 9 is a cross-sectional view schematically showing an atomic cell of the atomic oscillator according to a third modification example of the first embodiment.

Next, an atomic oscillator 110 according to a modification example of the first embodiment will be described with reference to the drawings. FIG. 7 is a cross-sectional view schematically showing an atomic cell 31 of the atomic oscillator 110 according to the first modification example of the first embodiment. In FIG. 7, and FIGS. 8 and 9 to be described later, X, Y, and Z axes are shown as three axes orthogonal to each other.

Hereinafter, in the atomic oscillator 110 according to the first modification example of the first embodiment, differences from the example of the atomic oscillator 100 according to the above-described first embodiment will be described, and description of similar points will be omitted. This is the same in atomic oscillators according to second and third modification examples of the first embodiment described later.

In the atomic oscillator 100 described above, as shown in FIG. 4, the low thermal conductivity portion 118 has a slit structure. In contrast to this, in the atomic oscillator 110, as shown in FIG. 7, the low thermal conductivity portion 118 has a hollow structure. In the illustrated example, the fourth wall 128 has a part positioned on the −X axis direction side of the fourth space 108 and surrounds the fourth space 108.

In the atomic oscillator 110, since the low thermal conductivity portion 118 has a hollow structure, the atomic cell 31 is robust as compared with the case where the thermal conductivity portion has a slit structure, for example.

1.2.2. Second Modification Example

Next, an atomic oscillator 120 according to a second modification example of the first embodiment will be described with reference to the drawings. FIG. 8 is a cross-sectional view schematically showing the atomic cell 31 of the atomic oscillator 120 according to the second modification example of the first embodiment.

In the atomic oscillator 100 described above, as shown in FIG. 4, the low thermal conductivity portion 118 has the fourth space 108. In contrast to this, in the atomic oscillator 120, as shown in FIG. 8, the low thermal conductivity portion 118 has a low thermal conductivity member 119 having a lower thermal conductivity than the thermal conductivity of the material forming the first wall 122 and the thermal conductivity of the material forming the second wall 124. The low thermal conductivity member 119 is disposed on the fourth wall 128.

Specifically, a thermal conductivity of the material forming the low thermal conductivity member 119 is lower than the thermal conductivity of the material forming the walls 122, 124, and 126. In the illustrated example, the low thermal conductivity member 119 is filled in the space defined by the fourth wall 128. The material of the low thermal conductivity member 119 is, for example, a polytetrafluoroethylene, a polyetheretherketone (PEEK), or the like.

In the atomic oscillator 120, the low thermal conductivity portion 118 is disposed between the fourth wall 128 and the fourth wall 128, and includes the low thermal conductivity member 119 having a thermal conductivity lower than the thermal conductivity of the material forming the first wall 122 and the thermal conductivity of the material forming the second wall 124. Therefore, in the atomic oscillator 120, for example, the atomic cell 31 is robust as compared with the case where the low thermal conductivity portion 118 does not have the low thermal conductivity member 119 and the fourth wall 128 defines only a space.

1.2.3. Third Modification Example

Next, an atomic oscillator 130 according to a third modification example of the first embodiment will be described with reference to the drawings. FIG. 9 is a cross-sectional view schematically showing the atomic cell 31 of the atomic oscillator 130 according to the third modification example of the first embodiment.

In the atomic oscillator 100 described above, as shown in FIG. 4, the length along the X axis of the second space 104 of the second chamber 114 is the same as the length along the X axis of the first space 102 of the first chamber 112. In contrast to this, in the atomic oscillator 130, as shown in FIG. 9, the length along the X axis of the second space 104 of the second chamber 114 is smaller than the length along the X axis of the first space 102 of the first chamber 112.

The atomic oscillator 130 does not have the second temperature control element 37b and the second temperature detection element 38b. The second chamber 114 may not be surrounded by the second holding member 34 shown in FIG. 3.

In the atomic oscillator 130, the length along the X axis of the second space 104 of the second chamber 114 is smaller than the length along the X axis of the first space 102 of the first chamber 112. Therefore, in the atomic oscillator 130, as compared with the case where the length along the X axis of the second space 104 of the second chamber 114 is the same as the length along the X axis of the first space 102 of the first chamber 112, the second chamber 114 is easily kept at a constant temperature by the first temperature control element 37a which heats the first chamber 112 and is hardly influenced by the temperature outside the atomic oscillator 130.

2. Second Embodiment

2.1. Atomic Oscillator

Figure 10:
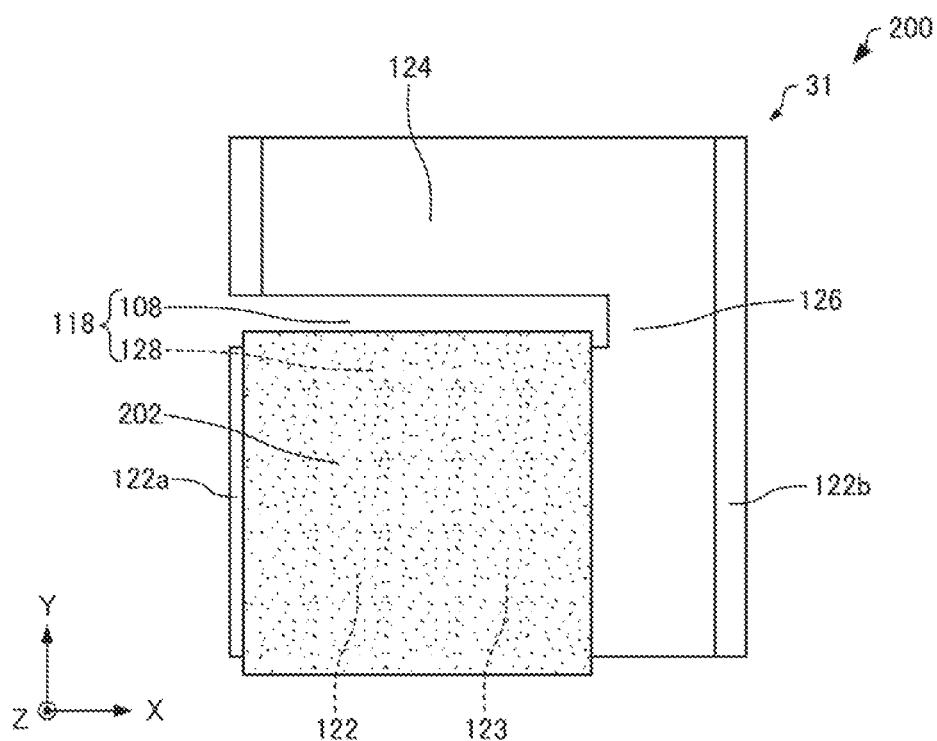
FIG. 10 is a plan view schematically showing an atomic cell of an atomic oscillator according to a second embodiment.
Figure 11:
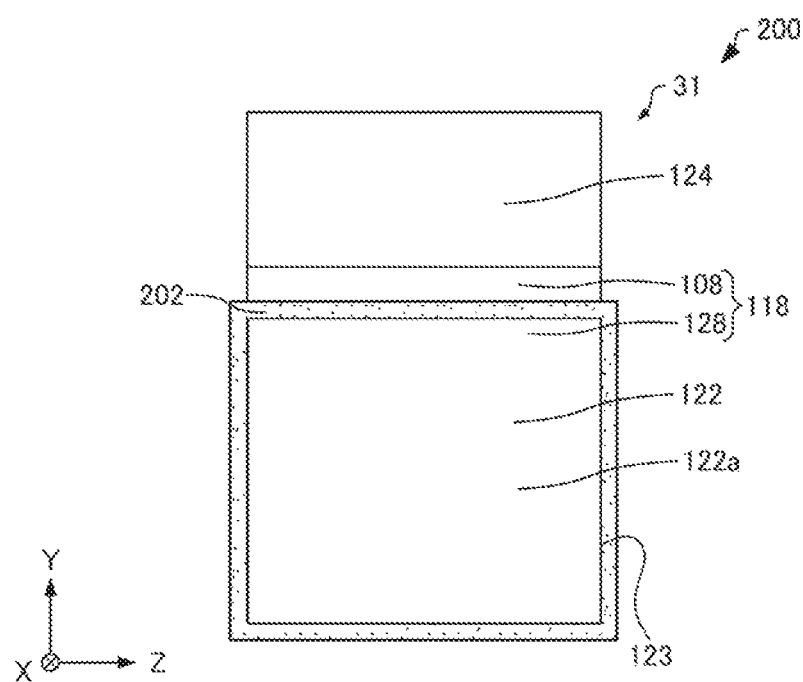
FIG. 11 is a side view schematically showing the atomic cell of the atomic oscillator according to the second embodiment.

Next, an atomic oscillator 200 according to a second embodiment will be described with reference to the drawings. FIG. 10 is a plan view schematically showing an atomic cell 31 of the atomic oscillator 200 according to the second embodiment. FIG. 11 is a side view schematically showing the atomic cell of the atomic oscillator 200 according to the second embodiment. In FIGS. 10 and 11, X, Y, and Z axes are shown as three axes orthogonal to each other.

Hereinafter, in the atomic oscillator 200 according to the second embodiment, differences from the example of the atomic oscillator 100 according to the above-described first embodiment will be described, and description of similar points will be omitted.

The atomic oscillator 200 is different from the atomic oscillator 100 described above in that a high thermal conductivity member 202 having a thermal conductivity higher than the thermal conductivity of the material forming the first wall 122 is disposed on the outer surface 123 of the first wall 122.

The high thermal conductivity member 202 is disposed, for example, so as to surround the first wall 122. In the illustrated example, the high thermal conductivity member 202 is disposed on the outer surface 123 facing in the +Z axis direction of the first wall 122, the outer surface 123 facing in the +Y axis direction of the first wall 122, the outer surface 123 facing in the −Z axis direction of the first wall 122, and the outer surface 123 facing in the −Y axis direction of the first wall 122.

The high thermal conductivity member 202 is disposed on the fourth wall 128 of the first chamber 112 side. In the illustrated example, the high thermal conductivity member 202 is disposed on a surface facing the +Y axis direction side of the fourth wall 128. The high thermal conductivity member 202 is, for example, in contact with the first holding member 33 shown in FIG. 3. The high thermal conductivity member 202 is disposed, for example, between the first wall 122 and the first holding member 33.

A material of the high thermal conductivity member 202 is, for example, a graphite, a copper, or the like. The high thermal conductivity member 202 may be a graphite sheet. The high thermal conductivity member 202 may be a copper wire. Preferably, the high thermal conductivity member 202 has low magnetic permeability so that the magnetic field of the coil 39 shown in FIG. 1 is applied to the alkali metal atoms contained in the first chamber 112. The high thermal conductivity member 202, for example, is not transparent with respect to the light emitted from the light emitting element 12. The high thermal conductivity member 202 may be darkly colored so as not to transmit the light emitted from the light emitting element 12.

The atomic oscillator 200 has, for example, the following effects.

In the atomic oscillator 200, the high thermal conductivity member 202 having a thermal conductivity higher than the thermal conductivity of the material forming the first wall 122 is disposed on the outer surface 123 of the first wall 122. Therefore, in the atomic oscillator 200, as compared with the case where the high thermal conductivity member 202 is not disposed, the temperature gradient is small in the first chamber 112, and a uniformity of the temperature distribution can be improved. Therefore, in the atomic oscillator 200, for example, it is difficult for the alkali metal atoms to be precipitated in the first window 122a of the first wall 122 by the temperature of the second chamber 114.

Figure 12:
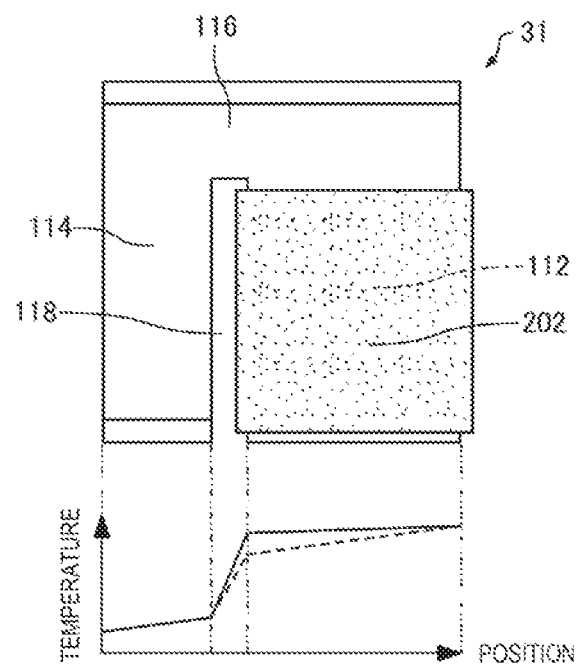
FIG. 12 is a graph schematically showing a relationship between a position and a temperature of the atomic cell.

Here, FIG. 12 is a graph schematically showing a relationship between a position in a direction from the second chamber 114 of the atomic cell 31 toward the first chamber 112 and the temperature of the atomic cell 31. In FIG. 12, the solid line indicates the atomic cell 31 of the atomic oscillator 200, and the broken line indicates the atomic cell in which the high thermal conductivity member 202 is not disposed. In the atomic oscillator 200, as shown in FIG. 12, the temperature gradient in the first chamber 112 is small, and the uniformity of the temperature distribution in the first chamber 112 is good.

In the atomic oscillator 200, the high thermal conductivity member 202 is disposed on the fourth wall 128 of the first chamber 112 side. Therefore, in the atomic oscillator 200, the uniformity of the temperature distribution of the first chamber 112 is good as compared with the case where the high thermal conductivity member 202 is not disposed on the fourth wall 128.

In the atomic oscillator 200, the high thermal conductivity member 202 is not transparent with respect to the light emitted from the light emitting element 12. Therefore, in the atomic oscillator 200, the amount in which the light emitted from the light emitting element 12 acts on the alkali metal atoms in a gas state, is difficult to change.

For example, when the high thermal conductivity member is not disposed, the light emitted from the light emitting element is scattered on the first wall. The scattered light detected by the light receiving element becomes noise with respect to the light with which the alkali metal atoms in a gas state is directly irradiated. In the atomic oscillator 200, since the high thermal conductivity member 202 is not transparent with respect to the light emitted from the light emitting element 12, the light emitted from the light emitting element 12 is hard to scatter on the first wall 122, and it is possible to make the above problems less likely to occur.

Although not shown, in the atomic oscillator 200, the low thermal conductivity portion 118 may have a hollow structure, as in the atomic oscillator 110 described above. In addition, the atomic oscillator 200 may include the low thermal conductivity member 119, as in the atomic oscillator 120 described above. Further, in the atomic oscillator 200, the length along the X axis of the second space 104 of the second chamber 114 may be smaller than the length along the X axis of the first space 102 of the first chamber 112, as in the atomic oscillator 130.

2.2. Modification Example of Atomic Oscillator

2.2.1. First Modification Example

Figure 13:
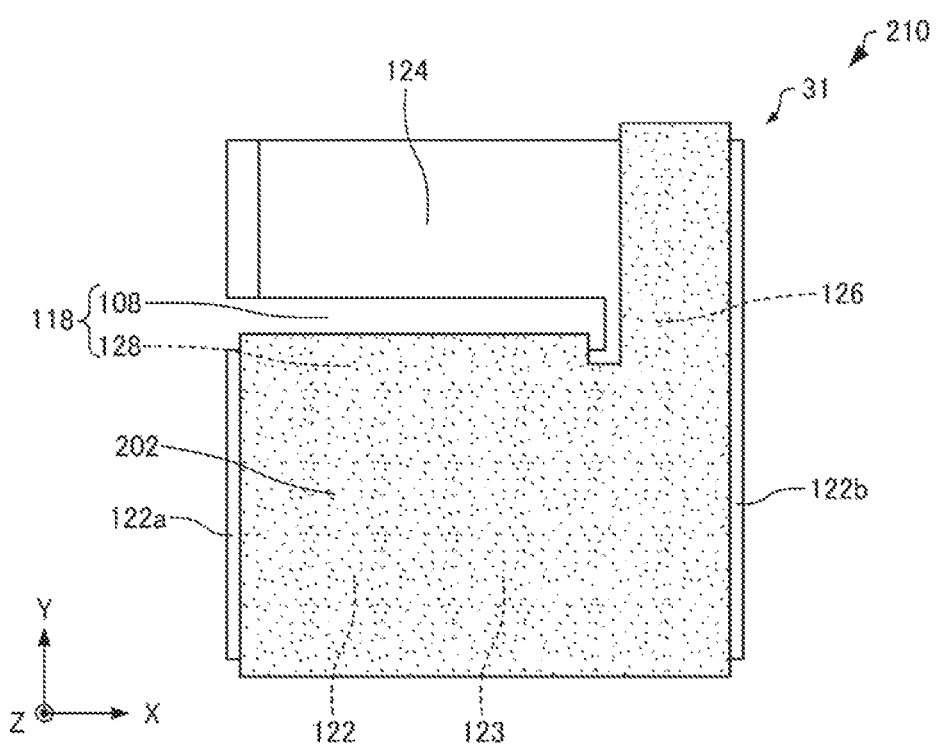
FIG. 13 is a plan view schematically showing an atomic cell of the atomic oscillator according to a first modification example of the second embodiment.

Next, an atomic oscillator 210 according to a first modification example of the second embodiment will be described with reference to the drawings. FIG. 13 is a plan view schematically showing the atomic cell 31 of the atomic oscillator 210 according to the first modification example of the second embodiment. Note that in FIG. 13, and FIGS. 14 to 18 to be described later, X, Y, and Z axes are shown as three axes orthogonal to each other.

Hereinafter, in the atomic oscillator 210 according to the first modification example of the second embodiment, differences from the example of the atomic oscillator 200 according to the above-described second embodiment will be described, and description of similar points will be omitted. This is the same in atomic oscillators according to second and third modification examples of the second embodiment described later.

In the atomic oscillator 200 described above, as shown in FIG. 10, the high thermal conductivity member 202 is disposed only on the first wall 122. In contrast to this, in the atomic oscillator 210, as shown in FIG. 13, the high thermal conductivity member 202 is also disposed on a part of the second wall 124.

In the illustrated example, the high thermal conductivity member 202 is disposed on a part connected to the third wall 126 of the second wall 124. Further, the high thermal conductivity member 202 is disposed on the third wall 126.

In the atomic oscillator 210, the high thermal conductivity member 202 is disposed on a part of the second wall 124. Therefore, in the atomic oscillator 210, as compared with the case where the high thermal conductivity member 202 is not disposed on the second wall 124, the volume of a part of the second chamber 114 in which the temperature is lower than the temperature of the first chamber 112 can be reduced, and it is easy to control the position of the alkali metal atoms M in a liquid state.

2.2.2. Second Modification Example

Figure 14:
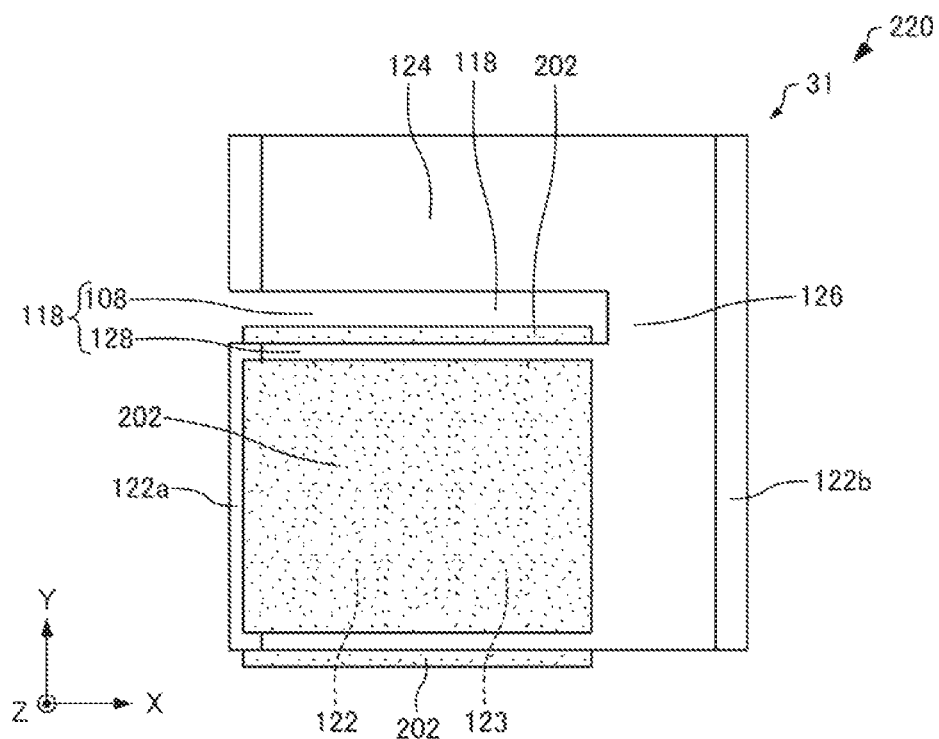
FIG. 14 is a plan view schematically showing an atomic cell of the atomic oscillator according to a second modification example of the second embodiment.
Figure 15:
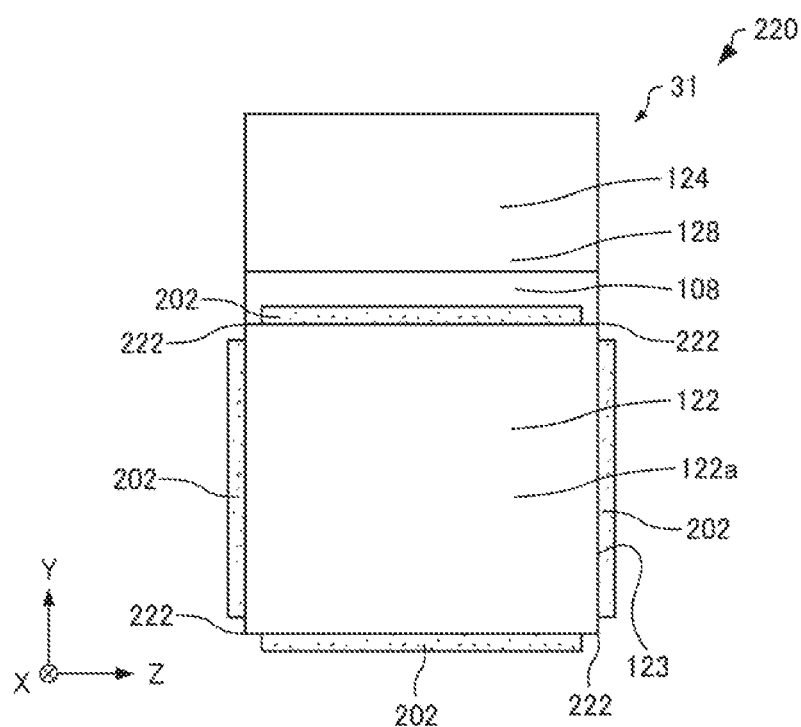
FIG. 15 is a side view schematically showing the atomic cell of the atomic oscillator according to the second modification example of the second embodiment.

Next, an atomic oscillator 220 according to a second modification example of the second embodiment will be described with reference to the drawings. FIG. 14 is a plan view schematically showing the atomic cell 31 of the atomic oscillator 220 according to the second modification example of the second embodiment. FIG. 15 is a side view schematically showing the atomic cell 31 of the atomic oscillator 220 according to the second modification example of the second embodiment.

In the atomic oscillator 200 described above, as shown in FIGS. 10 and 11, corners of the first wall 122 are covered with the high thermal conductivity member 202. In contrast to this, in the atomic oscillator 220, as shown in FIGS. 14 and 15, corners 222 of the first wall 122 are not covered with the high thermal conductivity member 202.

The high thermal conductivity members 202 are disposed on the first wall 122 avoiding the corners 222 of the first wall 122. In the illustrated example, four high thermal conductivity members 202 are disposed. A shape of the high thermal conductivity member 202 is, for example, a flat plate shape.

In the atomic oscillator 220, since the high thermal conductivity members 202 are disposed on the first wall 122 avoiding the corners 222, for example, as compared with the case where the high thermal conductivity member 202 covers the corners 222, fluctuation in the oscillation frequency of the atomic oscillator 220 can be suppressed by changing the thermal conductivity of the high thermal conductivity member 202 over time.

For example, in a case where the material of the high thermal conductivity member 202 is a graphite, when the high thermal conductivity members 202 are bent so as to cover the corners 222, a structure of the bent part is broken and the thermal conductivity is lowered, and the thermal conductivity of the part bent over time is changed in some cases. Therefore, there may be a case that the oscillation frequency of the atomic oscillator fluctuates. In the atomic oscillator 220, it is possible to make the above problem less likely to occur.

2.2.3. Third Modification Example

Figure 16:
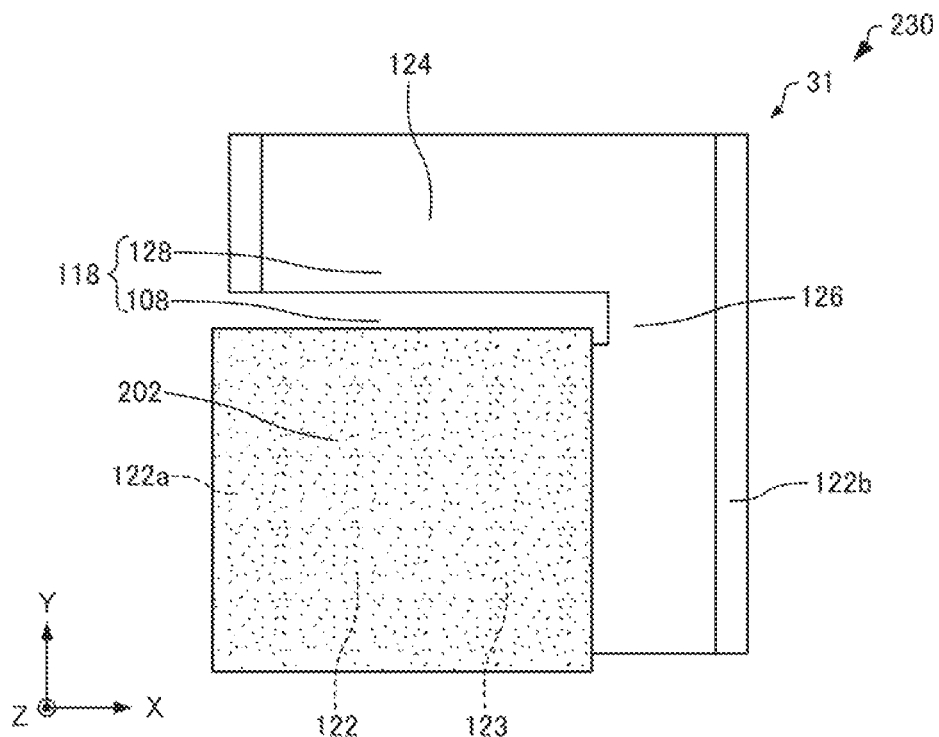
FIG. 16 is a plan view schematically showing an atomic cell of the atomic oscillator according to a third modification example of the second embodiment.
Figure 17:
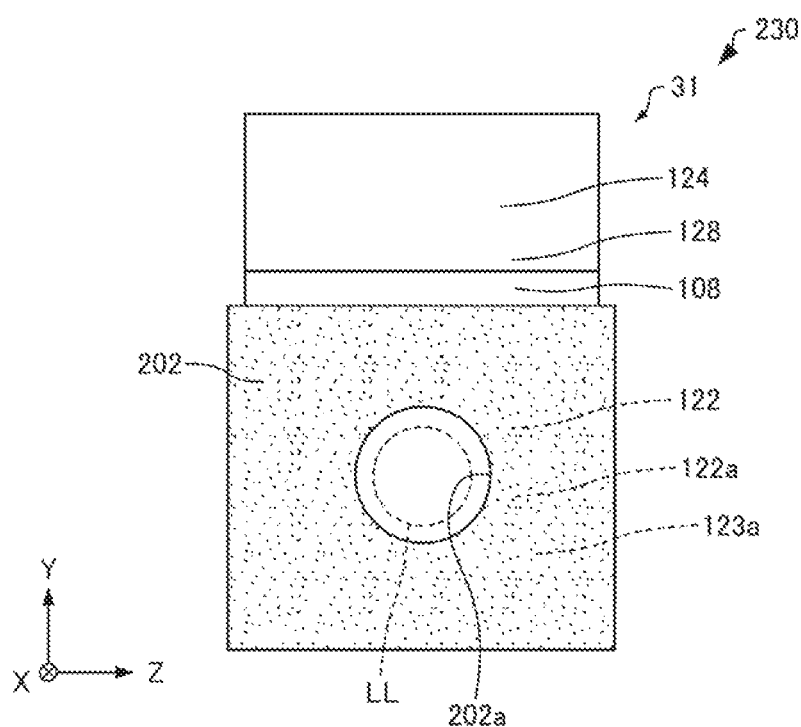
FIG. 17 is a side view schematically showing the atomic cell of the atomic oscillator according to the third modification example of the second embodiment.

Next, an atomic oscillator 230 according to a third modification example of the second embodiment will be described with reference to the drawings. FIG. 16 is a plan view schematically showing the atomic cell 31 of the atomic oscillator 230 according to the third modification example of the second embodiment. FIG. 17 is a side view schematically showing the atomic cell 31 of the atomic oscillator 230 according to the third modification example of the second embodiment.

In the atomic oscillator 200 described above, as shown in FIGS. 10 and 11, the high thermal conductivity member 202 is not disposed on the first window 122a of the first wall 122. In contrast to this, in the atomic oscillator 230, as shown in FIGS. 16 and 17, the high thermal conductivity member 202 is disposed on an outer surface 123a of the first window 122a. In the illustrated example, the outer surface 123a is a surface facing the Z axis minus direction.

As shown in FIG. 17, the high thermal conductivity member 202 is provided with a through hole 202a through which the light LL emitted from the light emitting element 12 passes. In the illustrated example, the shape of a wall surface defining the through hole 202a is a circular shape. When viewed from the X axis direction, the diameter of the through hole 202a is larger than the diameter of the light LL. The high thermal conductivity member 202 is not irradiated with the light LL.

In the atomic oscillator 230, the high thermal conductivity member 202 is disposed on the outer surface 123a of the first window 122a and the high thermal conductivity member 202 is provided with the through hole 202a through which the light LL emitted from the light emitting element 12 passes. Therefore, in the atomic oscillator 230, as compared with the case where the high thermal conductivity member 202 is not disposed on the outer surface 123a of the first window 122a, the uniformity of the temperature distribution in the first chamber 112 can be improved, for example, and it is difficult for the alkali metal atoms to be further precipitated in the first window 122a of the first wall 122 by the temperature of the second chamber 114.

Figure 18:
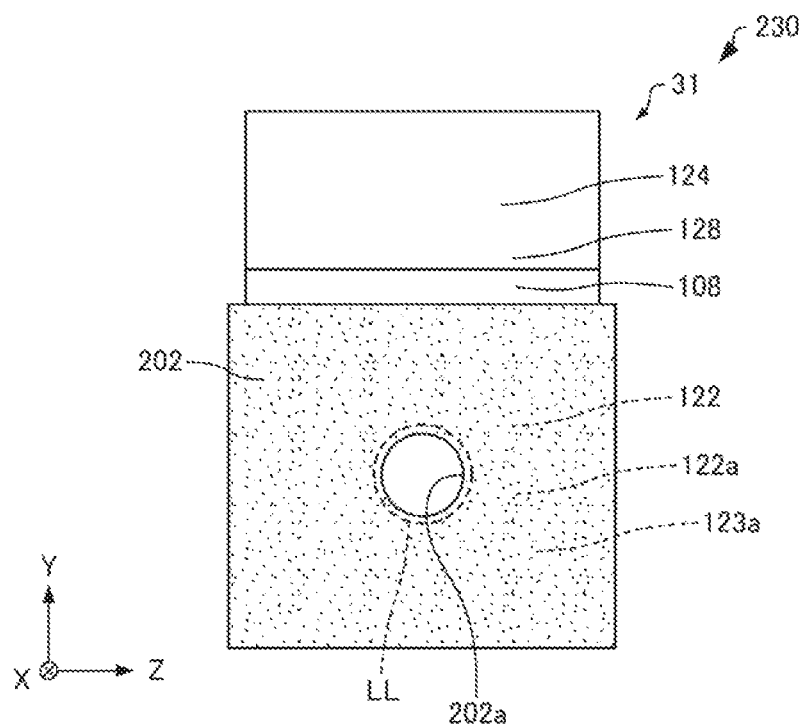
FIG. 18 is a side view schematically showing the atomic cell of the atomic oscillator according to the third modification example of the second embodiment.

As shown in FIG. 18, the diameter of the through hole 202a may be smaller than the diameter of the light LL when viewed from the X axis direction. The high thermal conductivity member 202 may shield a part of the light LL. In this case, for example, the diameter of the light LL passing through the first chamber 112 can be reduced by the high thermal conductivity member 202, and the light LL can be separated from the first wall 122 defining a direction orthogonal to the X axis of the first space 102. Therefore, it is possible to reduce the possibility that a frequency difference corresponding to an energy difference between the two ground levels of the alkali metal atoms in a gas state gets deviated. The alkali metal atoms in a gas state in the vicinity of the first wall 122 do not ideally resonate and there is a possibility that the frequency difference corresponding to the energy difference between the two ground levels of the alkali metal atoms in a gas state gets deviated.

3. Third Embodiment

3.1. Atomic Oscillator

Figure 19:
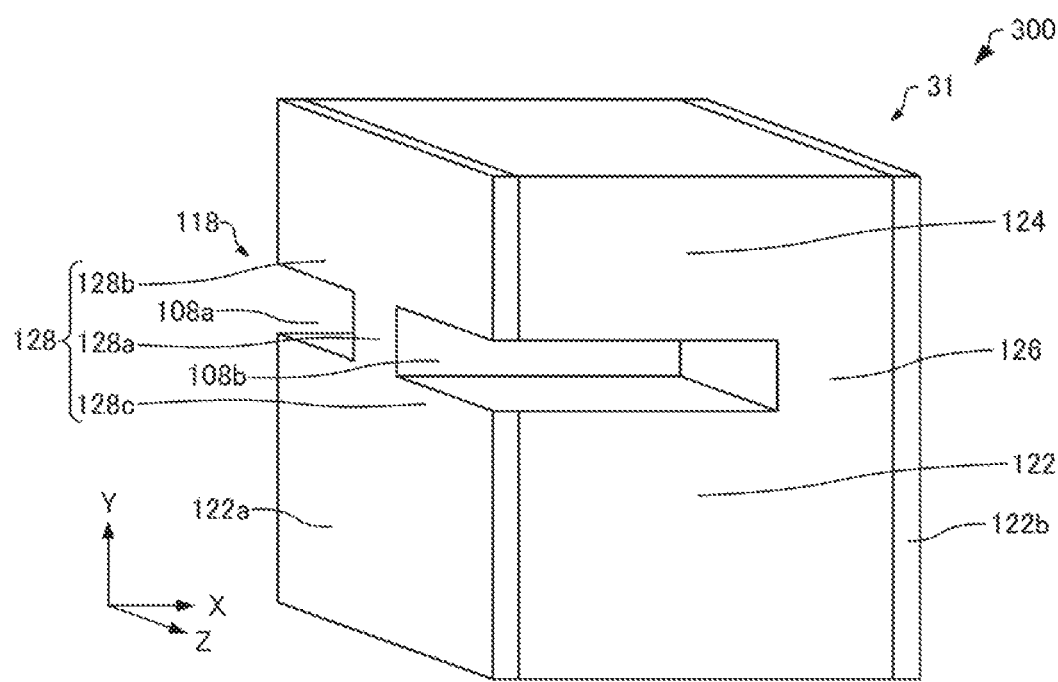
FIG. 19 is a perspective view schematically showing an atomic cell of an atomic oscillator according to a third embodiment.
Figure 20:
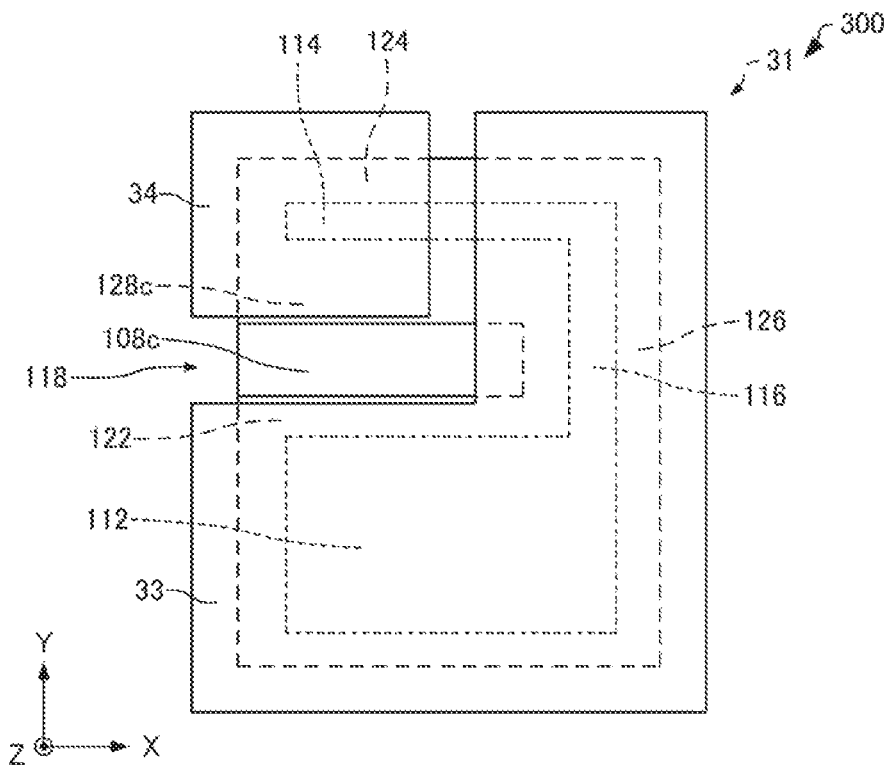
FIG. 20 is a plan view schematically showing the atomic cell of the atomic oscillator according to the third embodiment.
Figure 21:
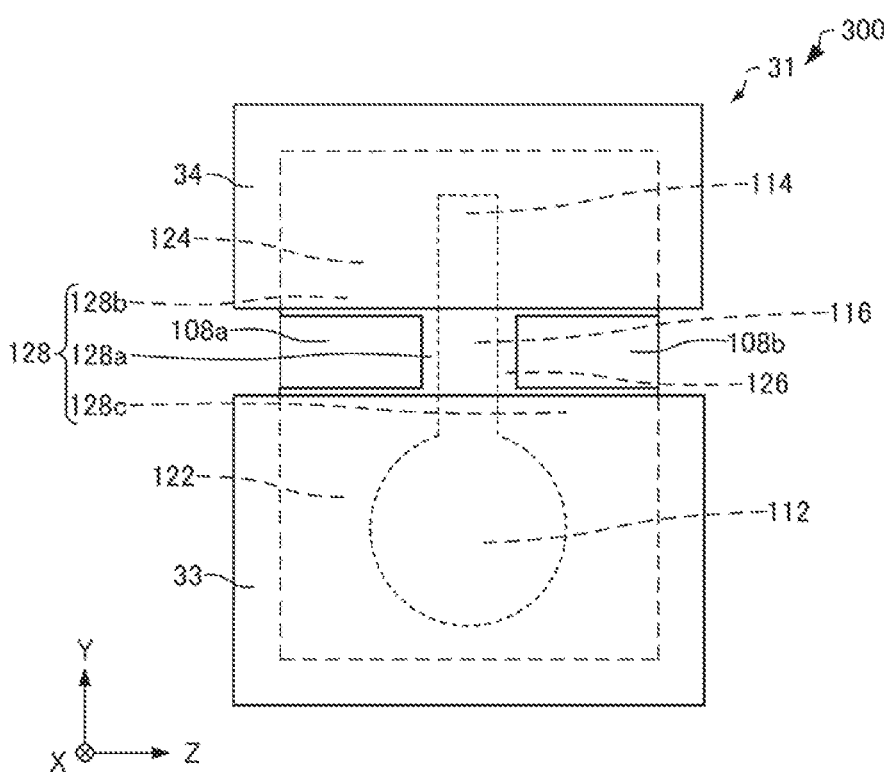
FIG. 21 is a side view schematically showing the atomic cell of the atomic oscillator according to the third embodiment.

Next, an atomic oscillator 300 according to a third embodiment will be described with reference to the drawings. FIG. 19 is a perspective view schematically showing an atomic cell 31 of the atomic oscillator 300 according to the third embodiment. FIG. 20 is a plan view schematically showing the atomic cell 31 of the atomic oscillator 300 according to the third embodiment. FIG. 21 is a side view schematically showing the atomic cell 31 of the atomic oscillator 300 according to the third embodiment. Note that in FIGS. 20 and 21, the holding members 33 and 34 are also shown. Further, in FIGS. 19 to 21, X, Y, and Z axes are shown as three axes orthogonal to each other.

Hereinafter, in the atomic oscillator 300 according to the third embodiment, differences from the example of the atomic oscillator 100 according to the above-described first embodiment will be described, and description of similar points will be omitted.

In the atomic oscillator 100 described above, as shown in FIGS. 4 and 5, the low thermal conductivity portion 118 has one fourth space 108. In contrast to this, in the atomic oscillator 300, as shown in FIGS. 19 to 21, the low thermal conductivity portion 118 has a fifth space 108a and a sixth space 108b which are separated from each other. The fourth wall 128 defines the spaces 108a and 108b.

The fourth wall 128 has a first part 128a, a second part 128b, and a third part 128c. The first part 128a connects the first chamber 112 and the second chamber 114 to each other. Specifically, the first part 128a connects the first wall 122 of the first chamber 112 and the second wall 124 of the second chamber 114 to each other.

The second part 128b configures the low thermal conductivity portion 118 having a slit structure on one side of the first part 128a. In the illustrated example, the second part 128b configures the low thermal conductivity portion 118 on the Z axis minus direction of the first part 128a. The second part 128b defines the fifth space 108a.

The third part 128c configures the low thermal conductivity portion 118 having a slit structure on the other side of the first part 128a. In the illustrated example, the third part 128c configures the low thermal conductivity portion 118 on the Z axis plus direction of the first part 128a. The third part 128c defines the sixth space 108b.

In the illustrated example, parts on the Y axis minus side of the second part 128b and the third part 128c are a part of the first wall 122. Parts on the Y axis plus side of the second part 128b and the third part 128c are a part of the second wall 124. Parts on the X axis plus side of the second part 128b and the third part 128c are a part of the third wall 126. A part on the Z axis plus side of the second part 128b is the first part 128a. A part on the Z axis minus side of the third part 128c is the first part 128a.

The atomic oscillator 300 has, for example, the following effects.

In the atomic oscillator 300, the fourth wall 128 includes the first part 128a connecting the first chamber 112 and the second chamber 114 to each other, the second part 128b configuring the low thermal conductivity portion 118 which has a slit structure in one side of the first part 128a, and the third part 128c configuring the low thermal conductivity portion 118 which has a slit structure in the other side of the first part 128a. Therefore, in the atomic oscillator 300, the atomic cell 31 is more robust as compared with the case where the fourth wall 128 does not have the first part 128a.

Note that, although not shown, the atomic oscillator 300 may include a low thermal conductivity member 119, as in the atomic oscillator 120 described above. Further, in the atomic oscillator 300, the length along the X axis of the second space 104 of the second chamber 114 may be smaller than the length along the X axis of the first space 102 of the first chamber 112, as in the atomic oscillator 130 described above. In addition, the atomic oscillator 300 may include the high thermal conductivity member 202, as in the atomic oscillator 200, 210, 220, and 230 described above.

3.2. Modification Example of Atomic Oscillator

Figure 22:
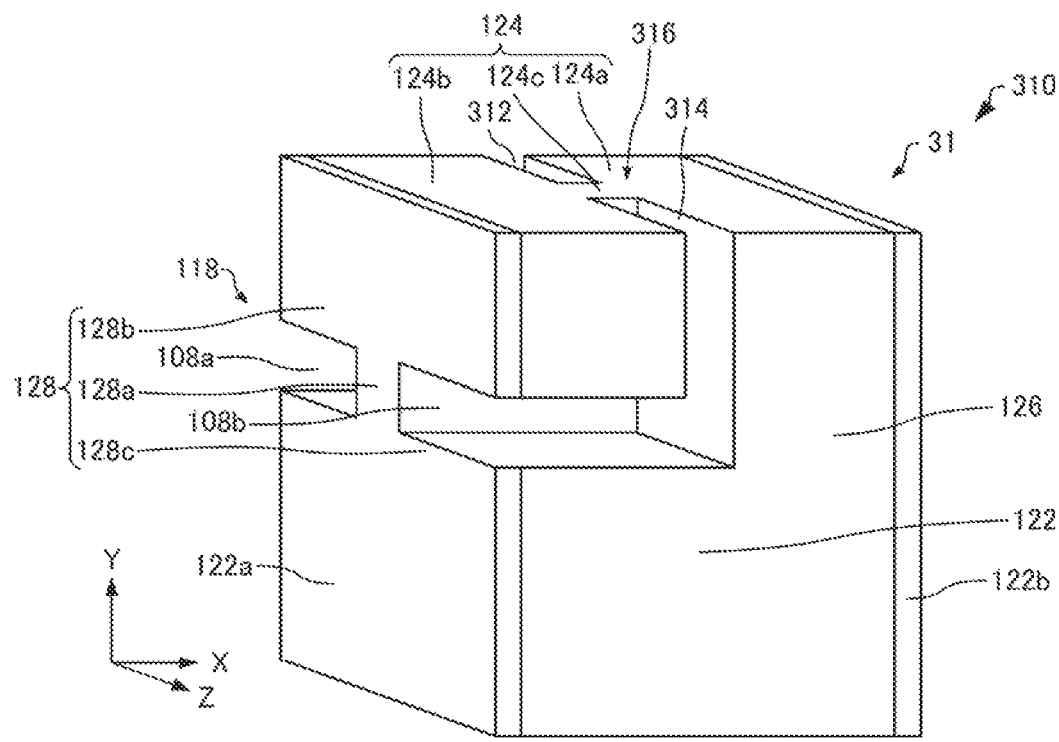
FIG. 22 is a perspective view schematically showing an atomic cell of the atomic oscillator according to a modification example of the third embodiment.
Figure 23:
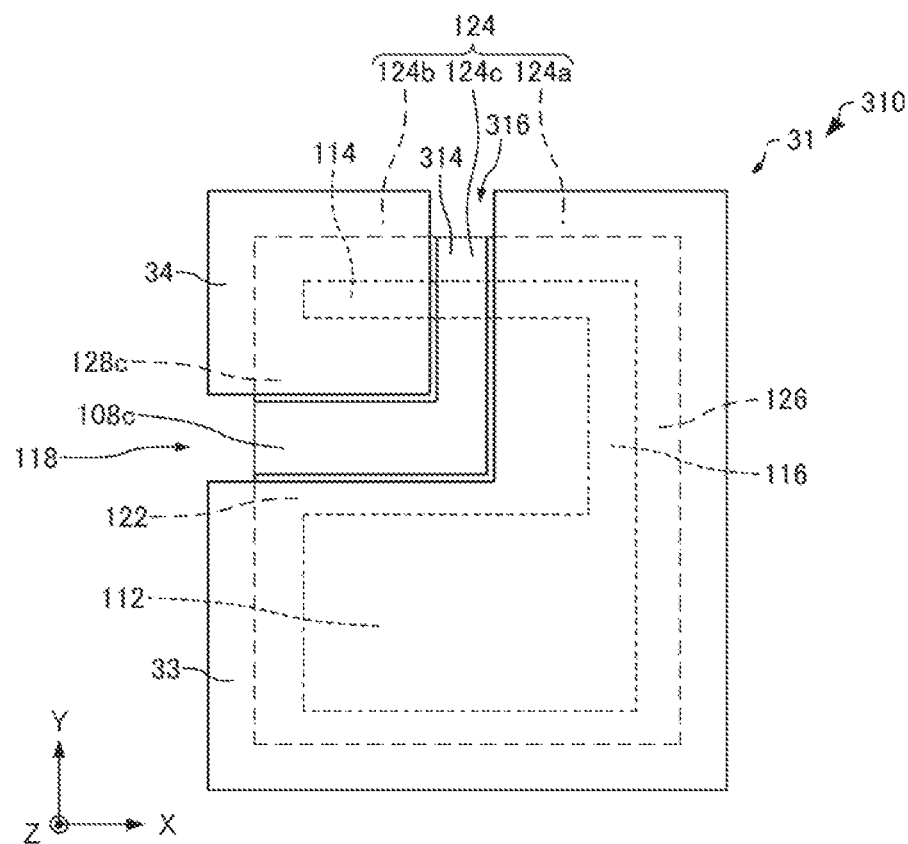
FIG. 23 is a plan view schematically showing the atomic cell of the atomic oscillator according to the modification example of the third embodiment.

Next, an atomic oscillator 310 according to a modification example of the third embodiment will be described with reference to the drawings. FIG. 22 is a perspective view schematically showing the atomic cell 31 of the atomic oscillator 310 according the modification example of to the third embodiment. FIG. 23 is a plan view schematically showing the atomic cell 31 of the atomic oscillator 310 according to the modification example of the third embodiment. Note that in FIG. 23, the holding members 33 and 34 are also shown. Further, in FIGS. 22 and 23, X, Y, and Z axes are shown as three axes orthogonal to each other.

Hereinafter, in the atomic oscillator 310 according to the modification example of the third embodiment, differences from the example of the atomic oscillator 300 according to the above-described third embodiment will be described, and description of similar points will be omitted.

As shown in FIGS. 22 and 23, the atomic oscillator 310 is different from the atomic oscillator 300 described above in that the second wall 124 defines a seventh space 312 and an eighth space 314.

In the atomic oscillator 310, the second wall 124 has a fourth part 124a, a fifth part 124b, and a sixth part 124c. The temperature of the fifth part 124b is lower than the temperature of the fourth part 124a. The fourth part 124a is a part covered with a first holding member 33 shown in FIG. 3. The fifth part 124b is a part covered with a second holding member 34 shown in FIG. 3.

The sixth part 124c defines the spaces 312 and 314 between the fourth part 124a and the fifth part 124b. The sixth part 124c and the spaces 312 and 314 configure a slit structure 316. In the illustrated example, a part on the X axis plus side of the sixth part 124c is a part common to the fourth part 124a. A part on the X axis minus side of the sixth part 124c is a part common to the fifth part 124b. The sixth part 124c has a part connecting the fourth part 124a and the fifth part 124b to each other. In the illustrated example, the slit structure 316 is a slit structure in which the Z axis minus side of the seventh space 312, the Z axis plus side of the eighth space 314, and the Y axis plus side of the spaces 312 and 314, are opened.

The spaces 312 and 314 are provided between the fourth part 124a and the fifth part 124b. In the illustrated example, the seventh space 312 is continuous with the fifth space 108a. The eighth space 314 is continuous with the sixth space 108b. In the illustrated example, the spaces 108a and 108b are directed from the X axis minus side of the atomic cell 31 toward the passage 116 side, and the spaces 312 and 314 are directed from the spaces 108a and 108b along the passage 116 toward the Y axis plus side of the atomic cell 31.

In the atomic oscillator 310, the second wall 124 has a fourth part 124a, a fifth part 124b having a temperature lower than the temperature of the fourth part 124a, and the sixth part 124c configuring the slit structure 316 between the fourth part 124a and the fifth part 124b. Therefore, in the atomic oscillator 310, as compared with the case where the sixth part 124c configuring the slit structure 316 between the fourth part 124a and the fifth part 124b is not provided, the first chamber 112 is less likely to be influenced by the temperature of the second chamber 114.

4. Fourth Embodiment

Figure 24:
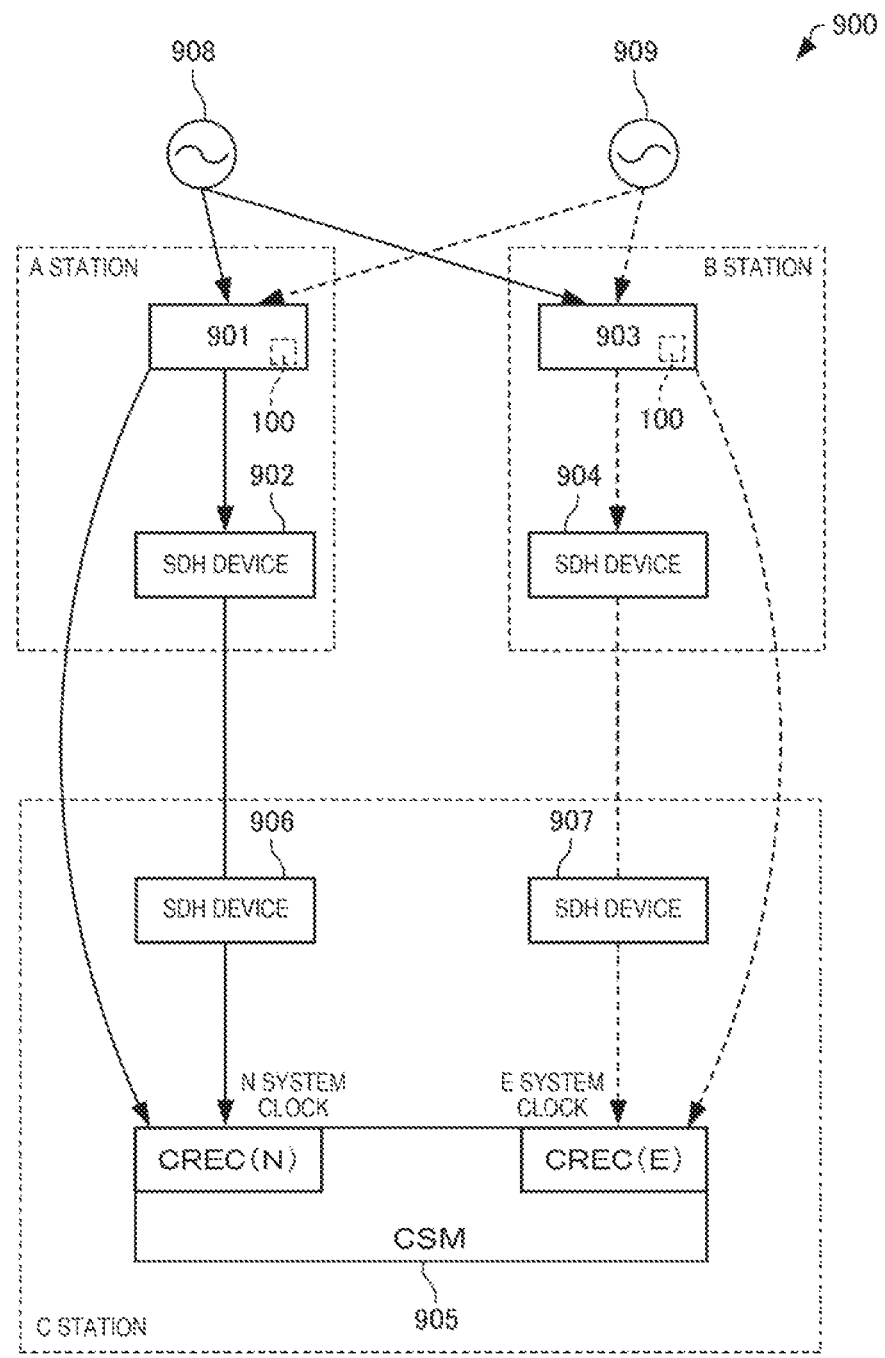
FIG. 24 is a schematic configuration view showing a frequency signal generation system according to a fourth embodiment.

Next, a frequency signal generation system according to a fourth embodiment will be described with reference to the drawings. The following clock transmission system as a timing server is an example of a frequency signal generation system. FIG. 24 is a schematic configuration diagram showing a clock transmission system 900.

The clock transmission system according to the present disclosure includes the atomic oscillator according to the present disclosure. In the following, the clock transmission system 900 including the atomic oscillator 100 will be described as an example.

The clock transmission system 900 is to synchronize a clock of each device in a time division multiplexing network, and is a system having a redundant configuration of a normal (N) system and an emergency (E) system.

As shown in FIG. 24, the clock transmission system 900 includes a clock supply device 901 and a synchronous digital hierarchy (SDH) device 902 of an A station (upper level (N system)), a clock supply device 903 and SDH device 904 of a B station (upper level (E system)), and a clock supply device 905 and SDH devices 906 and 907 of a C station (lower level). The clock supply device 901 has the atomic oscillator 100 and generates an N system clock signal. The atomic oscillator 100 in the clock supply device 901 generates a clock signal in synchronization with a more accurate clock signal from master clocks 908 and 909 including the atomic oscillator using a cesium.

Based on the clock signal from the clock supply device 901, the SDH device 902 transmits and receives a main signal, superimposes the N system clock signal on the main signal, and transmits the signal to the lower level clock supply device 905. The clock supply device 903 has the atomic oscillator 100 and generates an E system clock signal. The atomic oscillator 100 in the clock supply device 903 generates a clock signal in synchronization with a more accurate clock signal from master clocks 908 and 909 including the atomic oscillator using a cesium.

Based on the clock signal from the clock supply device 903, the SDH device 904 transmits and receives a main signal, superimposes the E system clock signal on the main signal, and transmits the signal to the lower level clock supply device 905. The clock supply device 905 receives the clock signal from the clock supply devices 901 and 903, and generates a clock signal in synchronization with the received clock signal.

The clock supply device 905 normally generates a clock signal in synchronization with the N system clock signal from the clock supply device 901. Then, when an abnormality occurs in the N system, the clock supply device 905 generates a clock signal in synchronization with the E system clock signal from the clock supply device 903. By switching from the N system to the E system like this, a stable clock supply can be guaranteed, and the reliability of the clock path network can be enhanced. The SDH device 906 transmits and receives the main signal based on the clock signal from the clock supply device 905. Similarly, the SDH device 907 transmits and receives the main signal based on the clock signal from the clock supply device 905. In this way, it is possible to synchronize the device of the station C with the device of the station A or the station B.

The frequency signal generation system according to the fourth embodiment is not limited to the clock transmission system. The frequency signal generation system is equipped with the atomic oscillator, and includes various devices using the frequency signal of the atomic oscillator and a system configured with a plurality of devices. The frequency signal generation system includes a terminal to which a frequency signal from the atomic oscillator is input and a controller to control the atomic oscillator.

The frequency signal generation system according to the fourth embodiment may be, for example, a smart phone, a tablet terminal, a timepiece, a portable phone, a digital still camera, a liquid ejecting apparatus such as an ink jet printer, a personal computer, a television, a video camera, a video tape recorder, a car navigation device, a pager, an electronic notebook, an electronic dictionary, a calculator, an electronic game machine, a word processor, a workstation, a video phone, a security television monitor, an electronic binoculars, a point of sales (POS) terminal, a medical machine, a fish finder, a global navigation satellite system (GNSS) frequency standard, various measuring machines, instruments, a flight simulator, a terrestrial digital broadcasting system, a portable phone base station, and a moving object.

Examples of the medical machine include, for example, an electronic clinical thermometer, a blood pressure manometer, a blood glucose meter, an electrocardiogram measurement device, an ultrasonic diagnostic device, an electronic endoscope, and a magnetocardiograph. Examples of the instruments include, for example, instruments such as a vehicle, an aircraft, and a ship. Examples of the moving object include, for example, a vehicle, an aircraft, a ship, or the like.

The present disclosure may omit a part of the configuration within a range having the features and effects described in this application, or combine each embodiment and modification.

The present disclosure includes a configuration (for example, a configuration having the same function, a method, and a result, or a configuration having the same object and effect) that is substantially the same as the configuration described in the embodiment. Further, the present disclosure includes a configuration in which non-essential parts of the configuration described in the embodiments are replaced. Further, the present disclosure includes a configuration that achieves the same operation and effect as the configuration described in the embodiments, or a configuration that can achieve the same object. Further, the present disclosure includes a configuration in which a known technique is added to the configuration described in the embodiments.

What is claimed is:

1. An atomic oscillator comprising:
a light emitting element;
an atomic cell including
   a first chamber containing alkali metal atoms in a gas state and having a first wall through which a light from the light emitting element passes,
   a second chamber containing alkali metal atoms in a liquid state and having a second wall,
   a passage connecting the first chamber and the second chamber to each other, and
   a part which is disposed between the first chamber and the second chamber, the part having a thermal conductivity lower than a thermal conductivity of a material of the first wall and a thermal conductivity of a material of the second wall; and
a light receiving element that receives the light passing through the atomic cell.

2. The atomic oscillator according to claim 1, wherein the part has a slit structure or a hollow structure.

3. The atomic oscillator according to claim 1, wherein the part including
   a wall, and
   a low thermal conductivity member disposed on the wall, the low thermal conductivity member having a thermal conductivity lower than the thermal conductivity of the material of the first wall and the thermal conductivity of the material of the second wall.

4. The atomic oscillator according to claim 1, further comprising:

a high thermal conductivity member disposed on an outer surface of the first wall, the high thermal conductivity member having a thermal conductivity higher than the thermal conductivity of the material forming the first wall.

5. The atomic oscillator according to claim 4, wherein
the part has a slit structure or a hollow structure, and
the high thermal conductivity member is disposed on a wall of the part on a side of the first chamber.

6. The atomic oscillator according to claim 4, wherein
the first wall has a window through which the light from the light emitting element passes,
the high thermal conductivity member is disposed on an outer surface of the window, and
the high thermal conductivity member having a through hole through which the light from the light emitting element passes.

7. The atomic oscillator according to claim 1, wherein
the part has a slit structure, and
a wall of the part including
   a first part connecting the first chamber and the second chamber to each other,
   a second part configuring the slit structure on one side of the first part, and
   a third part configuring the slit structure on the other side of the first part.

8. The atomic oscillator according to claim 7, wherein
the second wall including
   a fourth part,
   a fifth part having a temperature lower than a temperature of the fourth part, and
   a sixth part configuring the slit structure between the fourth part and the fifth part.

9. A frequency signal generation system comprising:
an atomic oscillator including
   a light emitting element,
   an atomic cell including
      a first chamber containing alkali metal atoms in a gas state and having a first wall through which the light from the light emitting element passes,
      a second chamber containing alkali metal atoms in a liquid state and having a second wall,
      a passage connecting the first chamber and the second chamber to each other, and
      a part which is disposed between the first chamber and the second chamber, the part having a thermal conductivity lower than a thermal conductivity of a material forming the first wall and a thermal conductivity of a material forming the second wall,
   and a light receiving element that receives the light passing through the atomic cell;
a terminal to which a frequency signal from the atomic oscillator is input; and
a controller that controls the atomic oscillator.

* * * * *